(12) United States Patent
Ebisawa et al.

(10) Patent No.: US 7,199,508 B2
(45) Date of Patent: Apr. 3, 2007

(54) COAXIAL FLEXIBLE PIEZOELECTRIC CABLE POLARIZER, POLARIZING METHOD, DEFECT DETECTOR, AND DEFECT DETECTING METHOD

(75) Inventors: Mitsuo Ebisawa, Kyoto (JP); Takeshi Nagai, Nara (JP); Tooru Sugimori, Yamatokooriyama (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 400 days.

(21) Appl. No.: 10/485,491

(22) PCT Filed: Aug. 1, 2002

(86) PCT No.: PCT/JP02/07860

§ 371 (c)(1),
(2), (4) Date: Jan. 30, 2004

(87) PCT Pub. No.: WO03/015188

PCT Pub. Date: Feb. 20, 2003

(65) Prior Publication Data

US 2004/0251772 A1 Dec. 16, 2004

(30) Foreign Application Priority Data

Aug. 2, 2001 (JP) ............................. 2001-234553
Aug. 2, 2001 (JP) ............................. 2001-234554
Aug. 2, 2001 (JP) ............................. 2001-234555
Dec. 14, 2001 (JP) ............................. 2001-381350

(51) Int. Cl.
*H01L 41/08* (2006.01)

(52) U.S. Cl. ...................... 310/357; 310/358; 310/800; 29/25.35; 361/233

(58) Field of Classification Search ................ 310/357, 310/363, 364, 369, 367, 323.14; 29/25.35; 361/233; *H01L 41/22, 41/087*
See application file for complete search history.

(56) References Cited

U.S. PATENT DOCUMENTS 4,392,178 A * 7/1983 Radice ........................ 361/233

(Continued)

FOREIGN PATENT DOCUMENTS

EP 146272 6/1985

(Continued)

OTHER PUBLICATIONS

Banno, Hisao and Ogura, Kohji; Piezoelectric Flexible Composites Consist of Piezoelectric Ceramic Powder and Synthetic Rubber; In: *Powder and Industry*, vol. 22, No. 1, pp. 50-56, 1990.

(Continued)

*Primary Examiner*—Mark Budd
(74) *Attorney, Agent, or Firm*—Pearne & Gordon LLP

(57) ABSTRACT

The invention provides a defect inspecting apparatus and a defect detecting method for specifying a position of a defect before polarization when the defect is included in a coaxial flexible piezoelectric member. Further, when a piezoelectric tube is moved in polarization, a friction force is produced between the coaxial flexible piezoelectric member and a block-like conductor and therefore, a large force is needed in moving the piezoelectric tube. The invention provides a polarizing apparatus and a polarizing method capable of moving the piezoelectric tube even by a small force.

There are provided a defect detecting apparatus of a coaxial flexible piezoelectric member having a constitution of applying a direct current to a coaxial flexible piezoelectric member while moving a piezoelectric tube arranged at a hole of inspecting electrode means and a marking apparatus for marking a defect portion. Thereby, when a defect is present at a portion thereof arranged at the hole of the inspecting electrode means, electricity is discharged at the defect portion and therefore, the defect portion can be specified and the mark can be attached to the defect portion. Further, a conductive block provided with a path portion of the piezoelectric tube is divided. By dividing the block-like conductor by a plural number, a friction force between the block-like conductor per divided one and the piezoelectric tube is reduced. Further, the piezoelectric tube can be moved by a small force by a pulley arranged at a fold back portion of the piezoelectric tube.

26 Claims, 16 Drawing Sheets

U.S. PATENT DOCUMENTS

| | | | |
|---|---|---|---|
| 4,568,851 A | | 2/1986 | Soni et al. |
| 4,629,925 A | * | 12/1986 | Booth et al. .................. 310/330 |
| 4,670,074 A | * | 6/1987 | Broussoux et al. .......... 156/198 |
| 4,715,098 A | * | 12/1987 | Booth et al. ................ 29/25.35 |
| 5,153,859 A | * | 10/1992 | Chatigny et al. ............ 367/140 |
| 5,336,422 A | * | 8/1994 | Scheinbeim et al. ... 252/62.9 R |
| 6,593,681 B2 | * | 7/2003 | Ebisawa et al. ............. 310/357 |
| 6,875,394 B2 | * | 4/2005 | Soulier ........................ 264/449 |

FOREIGN PATENT DOCUMENTS

| | | |
|---|---|---|
| JP | 54-113296 | 9/1979 |
| JP | 2001-99723 | 4/2001 |

OTHER PUBLICATIONS

Fox, David: A Novel Piezoelectric Sensor Cable; In: *Plastic and Rubber International*, vol. 12, No. 1, pp. 25-26, Feb. 1987.

* cited by examiner

COAXIAL FLEXIBLE PIEZOELECTRIC CABLE POLARIZER, POLARIZING METHOD, DEFECT DETECTOR, AND DEFECT DETECTING METHOD

TECHNICAL FIELD

The present invention relates to polarization of a coaxial flexible piezoelectric cable. Further, the invention relates to a defect detecting apparatus and a defect detecting method of the cable.

BACKGROUND ART

In a background art, as shown by FIG. 7, a coaxial flexible piezoelectric cable of this kind is constituted by forming an outer electrode 4 at an outer surface of a piezoelectric tube 3 formed with a coaxial flexible piezoelectric member 2 at a surrounding of a core electrode 1 and forming a protective core layer 5 at a surrounding thereof.

A flexible piezoelectric cable is generally polarized as follows.

Reference 1 (Piezoelectric composite material comprising piezoelectric ceramic powder and synthetic rubber, Powder and Industry, Vol. 22, No. 1, pages 50–56, 1990) shows that the coaxial flexible piezoelectric member 2 is polarized by applying high voltage between the core electrode 1 and the outer electrode 4. This is disclosed also in U.S. Pat. No. 4,568,851. A direction of spontaneous polarization of a ceramic particle is aligned in a direction of an electric field by polarization and therefore, a piezoelectric property is provided to the coaxial flexible piezoelectric member 2. The polarization plays an important role in this respect.

However, according to the above-described method, when high voltage is applied between the core electrode 1 and the outer electrode 4, a defect of a small crack, a clearance or the like is present in the coaxial flexible piezoelectric member 2. As a result, high voltage cannot be applied between the core electrode 1 and the outer electrode 4 and therefore, the coaxial flexible piezoelectric member 2 (normally having a length of several hundreds m or more) cannot be polarized. Further, presence of the defect cannot be detected until high voltage is applied between the core electrode 1 and the outer electrode 4, in other words, until finishing the coaxial flexible piezoelectric cable except polarization and therefore, fabrication thereof becomes unstable and yield is deteriorated. Therefore, it has been desired to specify a position at which the defect is present before polarization.

Therefore, the following polarizing methods are conceivable for the flexible piezoelectric cable.

As shown by FIG. 8, there is conceivable a polarizing apparatus arranging the piezoelectric tube 3 formed with the coaxial piezoelectric member 2 at the surrounding of the core electrode 1 at a piezoelectric tube s path portion 61 of a block-like conductor 6 and connecting direct current voltage generating means 9 between the block-like conductor 6 and the core electrode 1 via a lead wire 81 and a lead wire 82 to apply the direct current voltage. Or, as shown by FIG. 9, there is conceivable a polarizing apparatus directly arranging the piezoelectric tube 3 to the block-like conductor 6 and connecting the direct current voltage generating means 9 between the block-like conductor 6 and the core electrode 1 via a lead wire 8 and the lead wire 81 to apply direct current voltage. According to the polarizing apparatus, the coaxial flexible piezoelectric member 2 is arranged at the block-like conductor 6 or the piezoelectric tube path 61 of the block-like conductor 6 and therefore, the block-like conductor 6 is operated as an outer electrode. Therefore, a portion of the coaxial flexible piezoelectric member 2 arranged at the block-like conductor 6 can be polarized by applying direct current voltage between the block-like conductor 6 and the core electrode 1 by the direct current voltage generating means 9.

However, according to the method of the related art, the following problem is posed.

When direct current voltage is applied between the block-like conductor 6 and the core electrode 1 by the direct current voltage generating means 9, a force of attracting the coaxial flexible piezoelectric member 2 and the block-like conductor 6 to each other is generated by an electrostatic force. Therefore, when the piezoelectric tube 3 is moved, a friction force is generated between the coaxial flexible piezoelectric member 2 and the block-like conductor 6 and the piezoelectric tube 3 cannot be moved or even when the piezoelectric tube 3 can be moved, a large force is needed.

The invention is for resolving the problem of the background art and it is an object thereof to provide a polarizing apparatus and a polarizing method of a coaxial flexible piezoelectric cable capable of moving the piezoelectric tube 3 by a small force.

Further, it is an object of the invention to provide a defect detecting apparatus and a defect detecting method for specifying a defect of a coaxial flexible piezoelectric cable before polarization.

DISCLOSURE OF THE INVENTION

In order to resolve the problem of the background art, according to a polarizing apparatus of a coaxial flexible piezoelectric cable of the invention, a path portion of a piezoelectric tube of a block-like conductor is provided with a recessed and projected portion for reducing a friction resistance. By the recesses and projections, a friction force between the piezoelectric tube and the path portion of the piezoelectric tube is reduced and the piezoelectric tube is made to be able to move by a small force.

Further, in order to resolve the problem of the related art, a polarizing apparatus of a coaxial flexible piezoelectric cable of the invention includes a path portion of a piezoelectric tube, the piezoelectric tube is arranged at a plurality of block-like conductors aligned in parallel and a plurality of pulleys arranged at fold back portions of the piezoelectric tube for moving the piezoelectric tube and, a direct current voltage is applied between the block-like conductor and a core electrode. By dividing the block-like conductor by a plural number, a friction force between the path portion of the piezoelectric tube per divided one and the piezoelectric tube is reduced. Further, the piezoelectric tube is made to be able to move by a small force by the plurality of pulleys arranged at the fold back portions of the piezoelectric tube.

Further, in order to resolve the problem of the related art, the invention provides a defect detecting apparatus of a coaxial flexible piezoelectric cable comprising inspecting electrode means having a hole arranged with a piezoelectric tube formed with a coaxial flexible piezoelectric member at a surrounding of a core electrode, moving means arranged after the inspecting electrode means for moving the piezoelectric tube and direct current voltage applying means connected to the inspecting electrode means and the core electrode. According to the invention, the coaxial flexible piezoelectric member is arranged at the hole of the inspecting electrode means and therefore, the inspecting electrode means is operated as an outer electrode. Therefore, a direct current voltage can be applied between the inspecting electrode means and the core electrode to apply on the coaxial flexible piezoelectric member by the direct current voltage applying means. When a defect is present at a portion of the coaxial flexible piezoelectric member arranged at the hole of the inspecting electrode means (hereinafter referred to as coaxial flexible piezoelectric member to be inspected), small discharge is brought about at the defect portion. In accordance with the small discharge, a discharge current is made to flow or sound or light is emitted and therefore, presence of the defect can easily be detected. Therefore, presence of the defect at the coaxial flexible piezoelectric member to be inspected can be specified.

Further, in order to resolve the above-described problem, the invention provides a defect detecting apparatus of a coaxial flexible piezoelectric cable, the defect detecting apparatus comprising inspecting electrode means having a hole arranged with a piezoelectric tube formed with a coaxial flexible piezoelectric member at a surrounding of a core electrode, moving means arranged after the inspecting electrode means for moving the piezoelectric tube and direct current voltage applying means connected to the inspecting electrode means and the core electrode.

According to the above-described invention, since the coaxial flexible piezoelectric member is arranged at the hole of the inspecting electrode means, the inspecting electrode means is operated as an outer electrode. Therefore, a direct current voltage can be applied to the coaxial flexible piezoelectric member by the direct current voltage applying means between the inspecting electrode means and the core electrode. When a defect is present at a portion of the coaxial flexible piezoelectric member arranged at the hole of the inspecting electrode means (hereinafter, referred to as coaxial flexible piezoelectric member to be inspected), small discharge is brought about at the defect portion. In accordance with small discharge, a discharge current is made to flow or sound or light is emitted and therefore, presence of the defect can easily be detected. Therefore, it can be specified that the defect is present at the coaxial flexible piezoelectric member to be inspected.

A polarizing apparatus according to Claim 1 is a polarizing apparatus of a coaxial flexible piezoelectric cable, the polarizing apparatus comprising a block-like conductor in which a path portion of a piezoelectric tube formed with a coaxial flexible piezoelectric member at a surrounding of a core electrode includes a path portion in a recessed and projected shape and direct current voltage generating means connected to the block-like conductor and the core electrode. By arranging the piezoelectric tube at the path portion of the block-like conductor, the block-like conductor is operated as an outer electrode. Therefore, by applying high voltage between the block-like conductor and the core electrode, a portion of the coaxial flexible piezoelectric member arranged with the block-like conductor can be polarized. Further, the path portion of the piezoelectric tube of the block-like conductor is constituted by the recessed and the projected shape. When the piezoelectric tube is moved, by the recesses and projections, the friction force between the piezoelectric tube and the path portion of the piezoelectric tube can be reduced and therefore, the piezoelectric tube can be moved by a small force.

According to the polarizing apparatus according to Claim 2, in addition to the constitution according to Claim 1, the piezoelectric tube arranged at the block-like conductor is heated and temperature of the piezoelectric tube can be controlled and therefore, the coaxial flexible piezoelectric member can be polarized at necessary temperature.

The polarizing apparatus according to Claim 3, is the polarizing apparatus of a coaxial flexible piezoelectric cable according to either one of Claims 1 and 2, wherein a metal net is arranged at the block-like conductor and the path portion of the piezoelectric tube is constituted by the metal net. By forming recesses and projections by using the metal net, the friction force between the piezoelectric tube and the path portion of the piezoelectric tube is reduced without working a surface of arranging the piezoelectric tube in the recessed and projected shape and the piezoelectric tube can be moved by a small force.

The polarizing apparatus according to Claim 4 is the polarizing apparatus of a coaxial flexible piezoelectric cable according to either one of Claims 1 and 2, wherein the block-like conductor is provided with a groove a surface of which is constituted by a recessed and projected shape and the portion of the piezoelectric tube to be arranged is constituted by the groove the surface of which is constituted by the recessed and projected shape. When the block-like conductor is heated, the piezoelectric tube arranged at the groove of the block-like conductor is heated from a bottom face and two wall faces of the groove. Therefore, the piezoelectric tube is further uniformly heated and therefore, the coaxial flexible piezoelectric member can be polarized at necessary temperature. Further, an upper portion thereof is opened and the piezoelectric tube can simply be arranged from the upper portion of the groove.

The polarizing apparatus according to Claim 5 is the polarizing apparatus of a coaxial flexible piezoelectric cable according to either one of Claims 1 and 2, wherein the block-like conductor is provided with a groove arranged with a metal net and the piezoelectric tube is arranged at the groove arranged with the metal net. By arranging the piezoelectric tube at the groove arranged with the metal net, the piezoelectric tube and the metal net are brought into contact with each other in a point-like shape. Therefore, the friction force between the piezoelectric tube and the face arranging the piezoelectric tube is reduced and the piezoelectric tube can be moved by a small force.

The invention described in Claim 6 is a polarizing method of a coaxial flexible piezoelectric cable, wherein a piezoelectric tube is arranged at a path portion of a block-like conductor and a direct current voltage is applied between the block-like conductor and the core electrode. Therefore, the block-like conductor is operated as an outer electrode and therefore, by applying high voltage between the block-like conductor and the core electrode, a portion of the coaxial flexible piezoelectric member arranged at the block-like conductor and the path portion of the block-like conductor can be polarized. The path portion of the piezoelectric tube of the block-like conductor is constituted by a recessed and projected shape to reduce the friction resistance. By the recesses and projections, the piezoelectric tube and the path portion of the piezoelectric tube are brought into contact with each other in a point-like shape. Therefore, the friction force between the piezoelectric tube and the face for arranging the piezoelectric tube is reduced and the piezoelectric tube can be moved by a small force. Further, the coaxial flexible piezoelectric member can be polarized by a necessary period of time by controlling a time period of stopping and moving the piezoelectric tube or a moving speed thereof.

The invention described in Claim 7 is the polarizing method of a coaxial flexible piezoelectric cable according to Claim 2, wherein the block-like conductor is heated by a heating block arranged with a heater and the direct current voltage is applied between the core line of the piezoelectric tube and the block-like conductor while heating the piezoelectric tube arranged at the block-like conductor. Since the temperature of the piezoelectric tube can be controlled, the coaxial flexible piezoelectric member can be polarized at necessary temperature.

A polarizing apparatus according to Claims 8 through 11 is a polarizing apparatus of a coaxial flexible piezoelectric cable, the polarizing apparatus comprising a plurality of block-like conductors each having a path portion of a piezoelectric tube formed with a coaxial flexible piezoelectric member at a surrounding of a core electrode and arranged in parallel, a plurality of pulleys arranged at fold back portions of the piezoelectric tube for moving the piezoelectric tube and direct current voltage generating means connected to the plurality of block-like conductors and the core electrode.

By arranging the piezoelectric tube at the path portions of the plurality of block-like conductors, the block-like conductor is operated as an outer electrode. The plurality of pulleys arranged at the fold back portions of the piezoelectric tube move the piezoelectric tube. Therefore, by applying high voltage between the block-like conductor and the core electrode, while moving a portion of the coaxial flexible piezoelectric member arranged at the block-like conductor or repeating to move and stop the coaxial flexible piezoelectric member, the coaxial flexible piezoelectric member can be polarized.

By dividing the block-like conductor by a plural number, the friction force between the path portion of the piezoelectric tube per divided one and the piezoelectric tube is reduced. Further, the piezoelectric tube can be moved by a small force by the plurality of pulleys arranged at the fold back portions of the piezoelectric tube.

The polarizing apparatus according to Claim 12 comprises the plurality of pulleys having the same diameter and successively retarded rotational numbers and the piezoelectric tube is moved by the plurality of pulleys arranged at the fold back portions of the piezoelectric tube. Further, since the speed of moving the piezoelectric tube is successively retarded, the coaxial flexible piezoelectric member can be polarized without pulling portions of the piezoelectric tube to each other by a difference of elongations of the portions of the piezoelectric tube or by a slight difference between the rotational numbers of the pulleys in addition to the constitution according to Claim 11.

The polarizing apparatus according to Claim 13 comprises a plurality of pulleys having the same rotational number and successively reduced diameters in addition to the constitution according to Claim 11 for moving the piezoelectric tube by the pulleys arranged at the fold back portions of the piezoelectric tube. Further, the speed of moving the piezoelectric tube is successively retarded and therefore, the coaxial flexible piezoelectric member can be polarized without pulling portions of the piezoelectric tube to each other by a difference of elongations of the portions of the piezoelectric tube or by a slight difference between the diameters of the pulleys.

According to a defect detecting apparatus of a coaxial flexible piezoelectric cable according to Claim 14, the coaxial flexible piezoelectric member is arranged at a hole of inspecting electrode means and therefore, the inspecting electrode means is operated as an outer electrode. Therefore, a direct current voltage can be applied on the coaxial flexible piezoelectric member between the inspecting electrode means and the core electrode by the direct current voltage applying means.

When a small defect is included in the coaxial flexible piezoelectric member to be inspected, small discharge is brought about at the defect portion. In accordance with small discharge, discharge current is made to flow or sound or light is emitted and therefore, the defect portion can be detected to be present at the coaxial flexible piezoelectric member to be inspected.

According to the defect inspecting apparatus of a coaxial flexible piezoelectric cable according to Claim 15, the inspecting electrode means is constituted by a metal. A metal is provided with a low electric resistance and easy to work and therefore, the metal is suitable for the inspecting electrode means.

According to the defect inspecting apparatus of a coaxial flexible piezoelectric cable according to Claim 16, the detecting electrode means is constituted by graphite. Graphite is provided with conductivity and is of low friction performance and therefore, the coaxial flexible piezoelectric member can smoothly be moved.

According to the defect detecting apparatus of a coaxial flexible piezoelectric cable according to Claim 17, a pole of the direct current voltage applying means connected to the core electrode is maintained at a ground potential. Therefore, even when the human body is brought into contact with the core electrode, safety can be maintained without being electrified.

According to the defect detecting apparatus of a coaxial flexible piezoelectric cable according to Claim 18, when the piezoelectric tube is arranged at a hole provided at the conductor constituting the inspecting electrode means, a direct current voltage is applied between the core line of the piezoelectric tube and the inspecting electrode means. When the piezoelectric tube is stopped or moved by moving means, the direct current voltage can be applied between the core line and the inspecting electrode means and therefore, the defect can continuously be detected.

The defect detecting apparatus of a coaxial flexible piezoelectric cable according to Claim 19 is arranged with marking means. When small discharge is brought about at the defect portion, the coaxial flexible piezoelectric member can be marked by operating the marking means. By specifying a distance between the inspecting electrode means and the marking means, a portion at which the defect is present can be specified.

Further, by arranging the marking means after the inspecting electrode means, the defect portion of the coaxial flexible piezoelectric member can be marked. That is, when the defect portion of the coaxial flexible piezoelectric member to be inspected at which small discharge is brought about is moved from the inspecting electrode means to a position of the marking means, the defect portion of the coaxial flexible piezoelectric member can be marked by operating the marking means.

According to the defect detecting apparatus of a coaxial flexible piezoelectric cable according to Claim 20, the marking means is a clamp apparatus. The coaxial flexible piezoelectric member is deformed by being pressed by the clamp apparatus. Therefore, a portion at which the defect is present can clearly be determined.

According to the defect detecting apparatus of a coaxial flexible piezoelectric cable according to Claim 21, the clamp apparatus of the marking means is provided with a heater. The defect portion of the coaxial flexible piezoelectric member to be inspected is heated simultaneously with being pressed by the clamp apparatus, a resin included in the coaxial flexible piezoelectric member is softened and the pressed and heated portion is easily deformed. Therefore, a portion at which the defect is present can clearly be determined.

According to the defect detecting apparatus of a coaxial flexible piezoelectric cable according to Claim 22, the marking means is a laser heating apparatus. A laser-irradiated portion of the defect portion of the coaxial flexible piezoelectric member to be inspected is melted by being heated by the laser heating apparatus. Therefore, a portion at which the defect is present can clearly be determined.

According to the defect detecting apparatus of a coaxial flexible piezoelectric cable according to Claim 23, the marking means is a hot wind heating apparatus. A heated portion of the defect portion of the coaxial flexible piezoelectric member to be inspected heated by the hot wind heating apparatus is melted. Therefore, the portion at which the defect is present can clearly de determined.

According to the defect inspecting apparatus of a coaxial flexible piezoelectric cable according to Claim 24, by providing current detecting means provided between the core electrode or the inspecting electrode means and the direct current voltage applying means, a portion at which the defect is present can clearly be determined.

According to the defect detecting apparatus of a coaxial flexible piezoelectric cable according to Claim 25, when the piezoelectric tube is arranged at a hole provided at the conductor constituting the inspecting electrode means, a direct current voltage is applied between the core line of the piezoelectric tube and the inspecting electrode means. When the piezoelectric tube is stopped or moved by moving means, the direct current voltage can be applied between the core line and the detecting electrode means and therefore, the defect can continuously be detected.

According to the defect detecting apparatus of a coaxial flexible piezoelectric cable according to Claim 26, when current is detected to flow by a predetermined value or higher by the current detecting means, a mark is attached to a surface of the piezoelectric tube by operating the marking means. Therefore, defect detecting operation of the coaxial flexible piezoelectric cable can continuously be carried out automatically.

Figure 1:
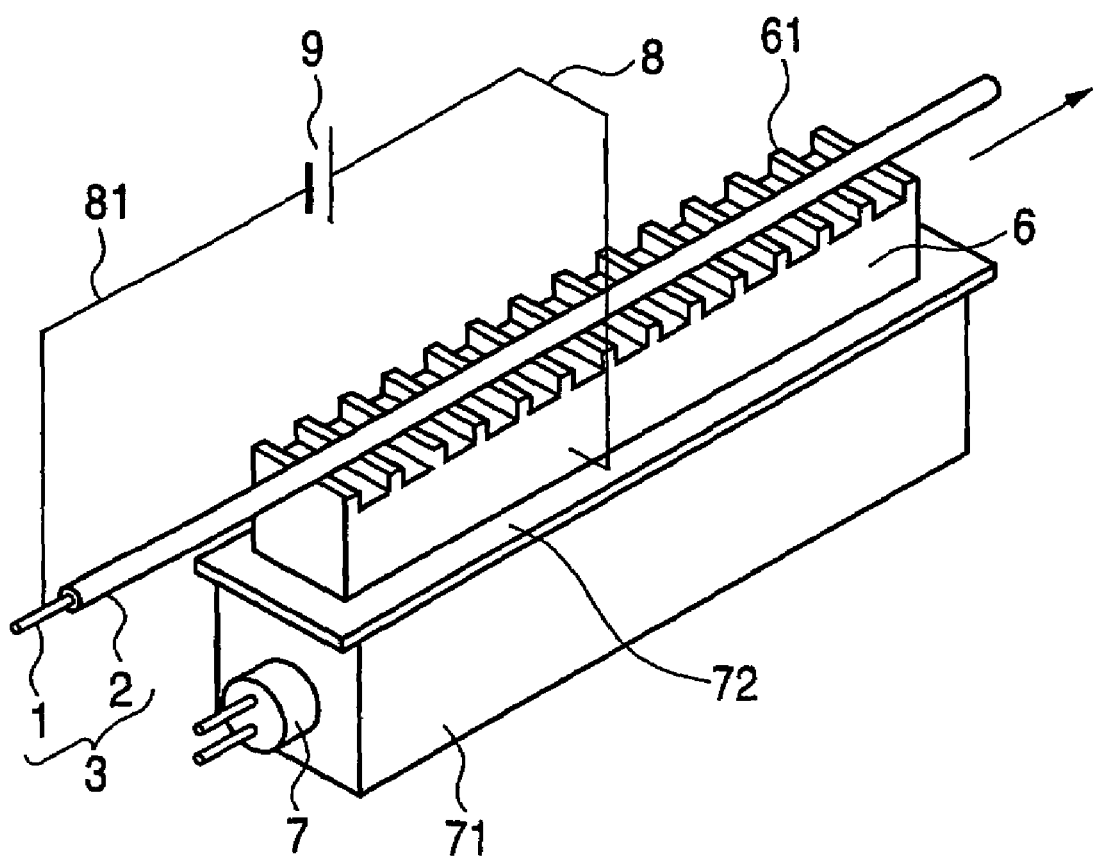
FIG. 1 is an outlook view showing a constitution of a polarizing apparatus according to Embodiment 1 of the invention.

Further, in the drawings, notation 1 designates a core electrode, notation 2 designates a coaxial flexible piezoelectric member, notation 3 designates a piezoelectric tube, notation 4 designates an outer electrode, notation 5 designates a protective cover layer, notation 6 designates a conductor block, notation 61 designates a piezoelectric tube path portion, notation 62 designates a recessed and projected shape, notation 7 designates a heater, notation 71 designates a heating block, notation 72 designates an insulating sheet, notation 73 designates an insulating member, notations, 8, 81, 82 designate lead wires, notation 9 designates direct current voltage generating means, notation 10 designates a metal net, notation 11 designates a groove, notations 17, 17a, 17b designate pulleys, notation 171 designates a groove of a pulley, notation 260 designates inspecting electrode means, notation 261 designates a hole, notations 270, 271 designate lead wires, notation 280 designates direct current voltage applying means, notation 290 designates a marking means, notations 301, 302 designate clamp metal pieces, notation 310 designates clamp apparatus, notation 311 designates a heater, notation 312 designates a laser apparatus, notation 321 designates laser beam, notation 313 designates a hot wind producing apparatus, notation 331 designates hot wind and notation 314 designates current detecting means.

BEST MODE FOR CARRYING OUT THE INVENTION

Embodiments of the invention will be explained in reference to FIGS. 1 through 16 as follows.

Embodiment 1

FIG. 1 is an outlook view showing a constitution of a coaxial flexible piezoelectric polarizing apparatus according to Embodiment 1 of the invention. The coaxial flexible piezoelectric member 2 is formed for the core electrode 1. The molded member is referred to as the piezoelectric tube 3. As the core electrode 1, a coil-like metal line, a line bundled with metal slender lines or the like is used. As the flexible piezoelectric member 2, a composite piezoelectric member of a polymer base material of epoxy resin, urethane resin, chloroprene resin, chlorinated polyethylene resin or the like added with a ceramic piezoelectric powder of titanate zirconate lead or a polymer piezoelectric member of PVDF or the like is used.

The piezoelectric tube 3 is arranged to the piezoelectric tube path portion 61 provided at the block-like conductor 6 and the piezoelectric tube 3 is moved by moving means (not illustrated). The piezoelectric tube path portion 61 is constituted by a recessed and projected shape. As the block-like conductor 6, a conductor of iron, stainless steel, copper, brass, aluminum, graphite or the like is used. Recesses and projections of the piezoelectric tube path portion 61 are formed by cutting, discharging, forging or the like. According to the embodiment, as a material of the block-like conductor 6, there is used aluminum which is easily available and can easily be worked. Specifically, in contrast to the piezoelectric tube 3 having an outer diameter of 2 millimeters the block-like conductor 6 is provided with a width of 30 millimeters, a height of 20 millimeters and a length of 5000 millimeters. Recesses and projections of the piezoelectric tube path portion 61 are provided with a recess depth of 0.5 mm, a recess width of 1.5 mm, and a projection width of 1 mm. That is, recesses and projections are continuously worked by a pitch of 2.5 mm. Recesses and projections of the piezoelectric tube path portion 61 may be constituted by knurling meshes of plane meshes, checker meshes or the like since it is an object thereof to reduce an area in contact with the piezoelectric tube 3. As moving means (not illustrated), the piezoelectric tube 3 is reeled by a reeling drum and the piezoelectric tube 3 is moved by rotating the reeling drum. Further, a direction of moving the piezoelectric tube 3 arranged at the block-like conductor 6 is indicated by an arrow mark.

Temperature in polarizing the coaxial flexible piezoelectric member 2 generally needs to be equal to or higher than temperature of using the coaxial flexible piezoelectric member 2 and polarization is carried out while maintaining the coaxial flexible piezoelectric member 2 at necessary temperature. Since the coaxial flexible piezoelectric member 2 is brought into contact with recesses and projections of the piezoelectric tube path portion 61, by heating the block-like conductor 6, the coaxial flexible piezoelectric member 2 can be heated to necessary temperature. In order to heat the block-like conductor 6 to necessary temperature, the heating block 71 arranged with the heater 7 is used and the block-like conductor 6 is heated to arbitrary temperature via the insulating sheet 72. Although according to the embodiment, as the insulating sheet 72, mica having a thickness of 0.5 millimeter is used, there may be used an electrically insulating material of polyimide, poly-tetra-fluoroethylene, polyethyleneterephthalate (abbreviated as PET), silicone rubber or the like.

The block-like conductor 6 and the lead wire 8 are electrically connected and the lead wire 8 is electrically connected to a positive pole or a negative pole of the direct current voltage generating means 9. Further, the core electrode 1 and the lead wire 81 are electrically connected and the lead wire 81 is connected to other electrode of the direct current voltage generating means 9. By connecting in this way, while making the piezoelectric tube 3 stationary or moving the piezoelectric tube 3, high voltage is applied between the core electrode 1 and the block-like conductor 6 by the direct current voltage generating means 9 to thereby polarize the coaxial flexible piezoelectric member 2. In polarization, high voltage of 5 through 10 kV/mm is applied between the core electrode 1 and the block-like conductor 6. Specifically, polarization of the piezoelectric tube 3 is carried out at temperature of 120° C. and by applied voltage of 8 kV/mm.

The piezoelectric tube path portion 61 is constituted by the recessed and projected shape to alleviate friction resistance. The piezoelectric tube 3 is brought into contact with only projection of recesses and projections. The force of attracting the coaxial flexible piezoelectric member 2 and the piezoelectric tube path portion 61 to each other by the electrostatic force is in proportion to an area of projections. Further, the friction force in moving the piezoelectric tube 3 is in proportion to the force of attracting the coaxial flexible piezoelectric member 2 and the piezoelectric tube path portion 61 to each other. That is, by the recesses and projections, the friction force between the piezoelectric tube 3 and the piezoelectric tube path portion 61 can be reduced and the piezoelectric tube 3 can be moved by small force.

Embodiment 2

Figure 2:
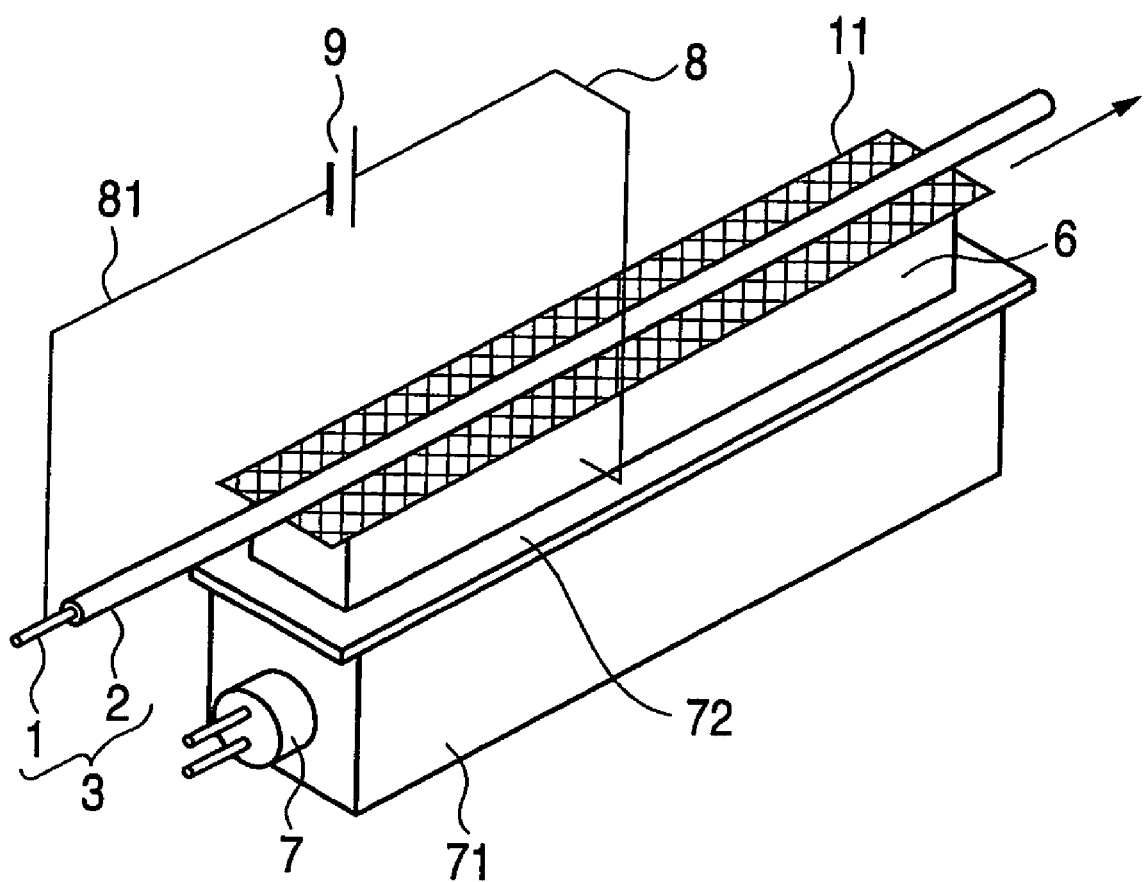
FIG. 2 is an outlook view showing a constitution of a polarizing apparatus according to Embodiment 2 of the invention.

FIG. 2 is an outlook view showing a constitution of a coaxial flexible piezoelectric polarizing apparatus according to Embodiment 2 of the invention. According to Embodiment 2, the piezoelectric tube path portion is constituted by the metal net 10. The piezoelectric tube 3 is arranged at the metal net 10 provided on a face of the block-like conductor 6 and is moved by moving means (not illustrated). A surface of the metal net 10 is constituted by a recessed and projected shape. By forming recesses and projections by using the metal net 10, the friction force between the piezoelectric tube 3 and the piezoelectric tube path portion (the metal net 10 according to Embodiment 2) without working a surface for arranging the piezoelectric tube 3 in a recessed and projected shape and the piezoelectric tube 3 can be moved by a small force.

As the metal net 10, a conductor of iron, stainless steel, copper, brass, aluminum or the like is used. According to the embodiment, as the material of the metal net 10, there is used stainless steel which is easily available and having corrosion resistance performance. Specifically, there is used a net of stainless steel having a wire diameter of 0.2 millimeter and a mesh of 50.

Embodiment 3

Figure 3:
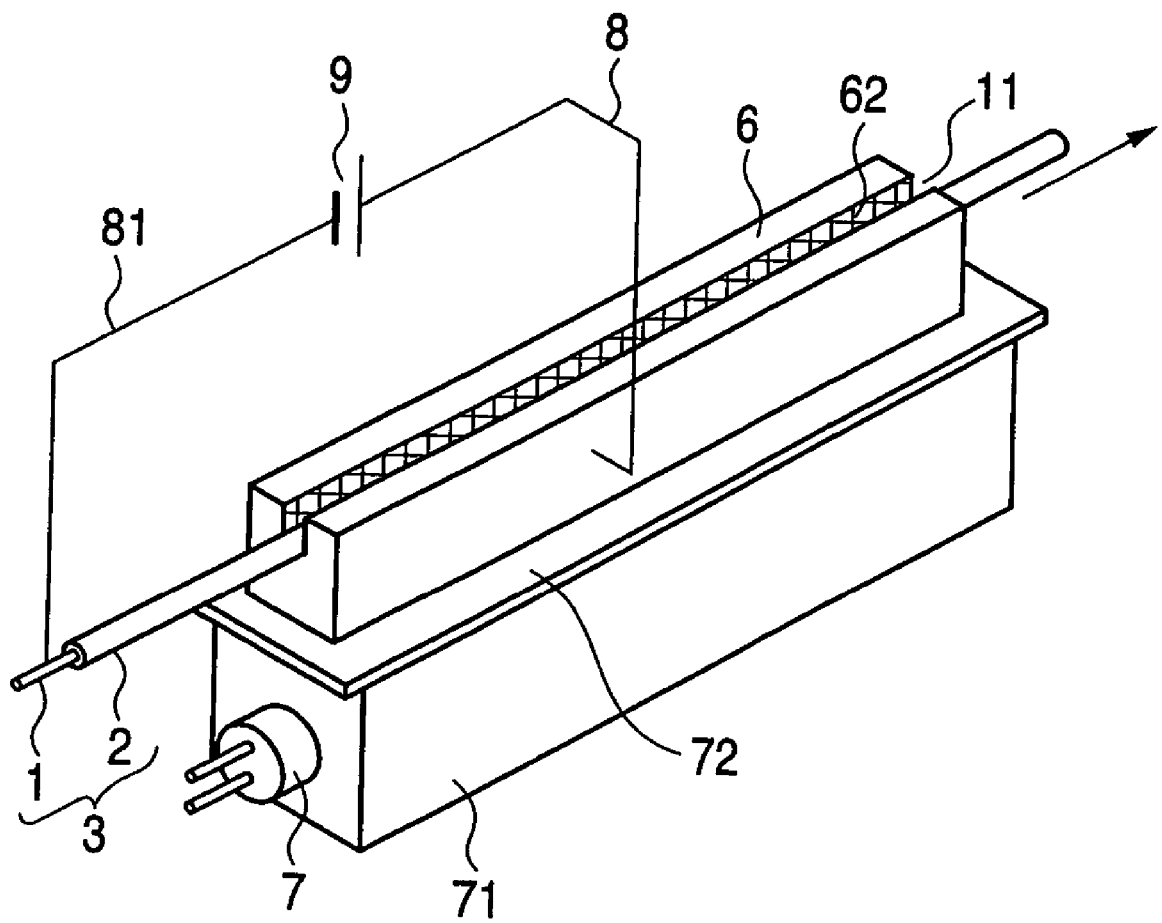
FIG. 3 is an outlook view showing a constitution of a polarizing apparatus according to Embodiment 3 of the invention.

FIG. 3 is an outlook view showing a constitution of a coaxial flexible piezoelectric polarizing apparatus according to Embodiment 4 of the invention. The polarizing apparatus is constituted by providing the groove 11 at the block-like conductor 6, constituting the path portion of the piezoelectric tube 3 by the groove 11 and constituting an inner face of the groove 11 by the recessed and projected shape 62. When the piezoelectric tube 3 arranged at the groove 11 of the block-like conductor 6 is heated by heating the block-like conductor 6, the piezoelectric tube 3 is heated from a bottom face and two wall faces of the groove 11. Therefore, the piezoelectric tube 3 is further uniformly heated and therefore, the coaxial flexible piezoelectric member 2 can be polarized at necessary temperature. Further, an upper portion thereof is opened and the piezoelectric tube 3 can simply be arranged from the upper portion of the groove 11. Further, since the inner face of the groove 11 constituting the path portion of the piezoelectric tube 3 is constituted by the recessed and projected shape 62, the piezoelectric tube 3 is brought into contact with only projections of recesses and projections and therefore, the piezoelectric tube 3 can be moved by a small force.

As the block-like conductor 6, a conductor of iron, stainless steel, copper, brass, aluminum, graphite or the like is used. The groove 1 can be constituted by any shape of a polygonal shape (triangular shape, quadrangular shape, pentagonal shape, hexagonal shape or the like), U-like shape or the like so far as the shape can arrange the piezoelectric tube 3. In working the groove 11, cutting, discharging extrusion or the like is used. With regard to forming the recessed and projected shape 62, there are a method of directly forming the inner face of the groove 11 by using cutting, discharging, pressing or the like and a method of arranging a conductive member formed with recesses and projections (metal net, punching sheet, pressed sheet formed with recessed and projected shape or the like) at the groove 11.

According to the embodiment, as the block-like conductor 6, aluminum is used, the shape of the groove 11 is constituted by a U-like shape such that the groove 11 can simply be worked by an end mill and a net of stainless steel is arranged at the inner face of the U-like shape, that is, to form the recessed and projected shape 62. Further, in FIG. 3, a direction of moving the piezoelectric tube 3 arranged at the block-like conductor 6 is indicated by an arrow mark.

Embodiment 4

Figure 4:
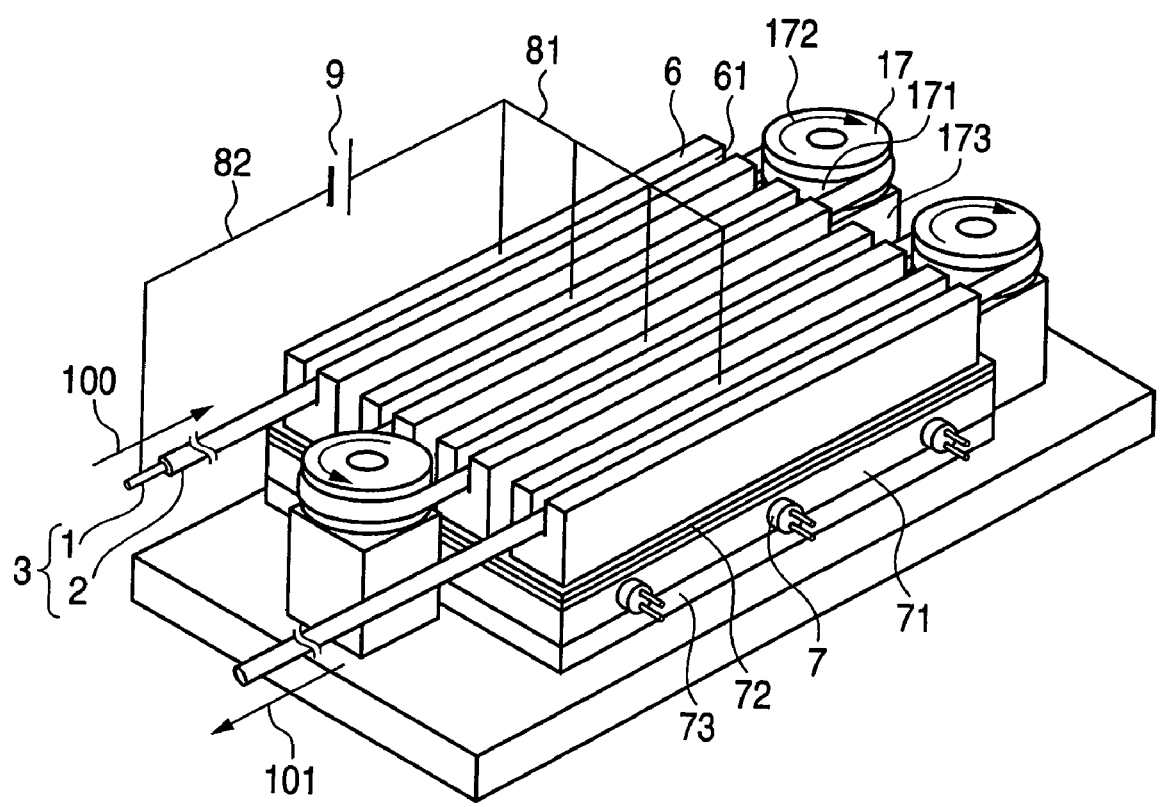
FIG. 4 is an outlook view showing a constitution of a polarizing apparatus according to Embodiment 4 of the invention.

FIG. 4 is an outlook view showing a constitution of a coaxial flexible piezoelectric polarizing apparatus according to a fourth embodiment. The coaxial flexible piezoelectric member 2 is formed for the core electrode 1. The molded body is referred to as the piezoelectric tube 3. As the core electrode 1, a coil-like metal line or a line bundled with metal slender lines or the like is used. As the coaxial flexible piezoelectric member 2, a composite piezoelectric member of a polymer base metal of epoxy resin, urethane resin, chloroprene resin, chlorinated polyethylene or the like added with a ceramic piezoelectric powder of titanate zirconate lead or a polymer piezoelectric member of PVDF or the like is used.

A plurality of pieces (4 pieces according to the embodiment) of the block-like conductors 6 are arranged in parallel. The block-like conductor 6 is provided with a groove of the piezoelectric tube path portion 61 and a conductor of iron, stainless steel, copper, brass, aluminum, graphite or the like is used for a material thereof. The piezoelectric tube path portion 61 is formed by cutting, discharging, forging for the like. According to the embodiment, as the material of the block-like conductor 6, there is used aluminum which is easily available and is easy to work. As specific dimensions, in contrast to the piezoelectric tube 3 having an outer diameter of 2 millimeters, the piezoelectric tube path portion 61 is constituted by a groove width of 3 millimeters and a groove depth of 7 millimeters and the block-like conductor 6 is constituted by a width of 30 millimeters and a height of 20 millimeters and a length of 1000 millimeters.

The pulley 17 is provided at a fold back portion (at 3 locations according to the embodiment) of the piezoelectric tube 3 and is driven by a pulley driving apparatus 173. The pulley 17 is provided with the groove 171. The groove 171 is constituted by a V-like shape or a U-like shape and the piezoelectric tube 3 is made to wrap thereon.

Heating of the piezoelectric tube 3 is carried out indirectly by heating the block-like conductor 6. In order to heat the block-like conductor 6 to necessary temperature, the heating block 71 arranged with the heater 7 is used to heat the block-like conductor 6 to arbitrary temperature via the insulating sheet 72. According to the embodiment, as the insulating sheet 72, a mica plate having a thickness of 0.5 millimeter is used. Further, a lower face of the heating block 71 is provided with the insulating member 73 to efficiently conduct heat to the block-like conductor 6 at the upper face of the heating block.

Voltage is applied to the coaxial flexible piezoelectric member 2 by using the core electrode 1 and the block-like conductor 6 as electrodes. Each of the block-like conductors 6 and one side of the lead wire 81 are electrically connected and other side of the lead wire 81 is electrically connected to a positive pole or a negative pole of the direct current voltage generating means 9. Further, the core electrode 1 and one side of the lead wire 82 are electrically connected and other side of the lead wire 82 is electrically connected to other pole of the direct current voltage generating means 9.

By the above-described constitution, the piezoelectric tube 3 is arranged successively to the piezoelectric tube path portion 61 provided at the block-like conductor 6 and the groove 171 of the pulley 17, each pulley 17 is driven by the pulley driving apparatus 173, and each pulley 17 is rotated in an arrow mark 172 direction. Further, the piezoelectric tube 3 is drawn from an arrow mark 100 direction, and the piezoelectric tube 3 is moved in an arrow mark 101 direction by drawing means (not illustrated).

In this way, while moving the piezoelectric tube 3, high voltage is applied between the core electrode 1 and the block-like conductor 6 by the direct current voltage generating means 9 to polarize the core axial flexible piezoelectric member 2. In polarization, high voltage of 5 through 10 kV/mm is applied between the core electrode 1 and the block-like conductor 6. Specifically, polarization is carried out by voltage of 8 kV/mm applied to the piezoelectric tube 3. Further, temperature in polarizing the coaxial flexible piezoelectric member 2 generally needs to be equal to or higher than temperature of using the coaxial flexible piezoelectric member 2 and polarization is carried out while maintaining the coaxial flexible piezoelectric member 2 at the necessary temperature. The coaxial flexible piezoelectric member 2 is brought into contact with a wall face of the piezoelectric tube path portion 61 in the U-like shape and therefore, by heating the block-like conductor 6, the coaxial flexible piezoelectric member 2 can be heated to necessary temperature. Specifically, polarization is carried out at temperature of the piezoelectric tube 3 of 120° C.

A plurality of pieces (4 pieces according to the embodiment) of the block-like conductors 6 provided with the piezoelectric tube path portions 61 are used to reduce the friction resistance with the coaxial flexible piezoelectric member 2 when moved in the piezoelectric tube path portions 61.

In polarization, high voltage of 5 through 10 kV/mm is applied between the core electrode 1 and the block-like conductor 6 and therefore, the piezoelectric tube 3 and the piezoelectric tube path portion 61 are attracted to each other by the electrostatic force and the friction force is produced when the piezoelectric tube 3 is moved. The friction force is in proportion to an area of bringing the coaxial flexible piezoelectric member 2 and the piezoelectric tube path portion 61 in contact with each other. That is, by using a plurality of pieces (4 pieces according to the embodiment) of the block-like conductors 6, a force exerted to each pulley 17 becomes 1/plural pieces (¼ according to the embodiment) and the piezoelectric tube 3 can be moved by a small force.

Embodiment 5

Figure 5:
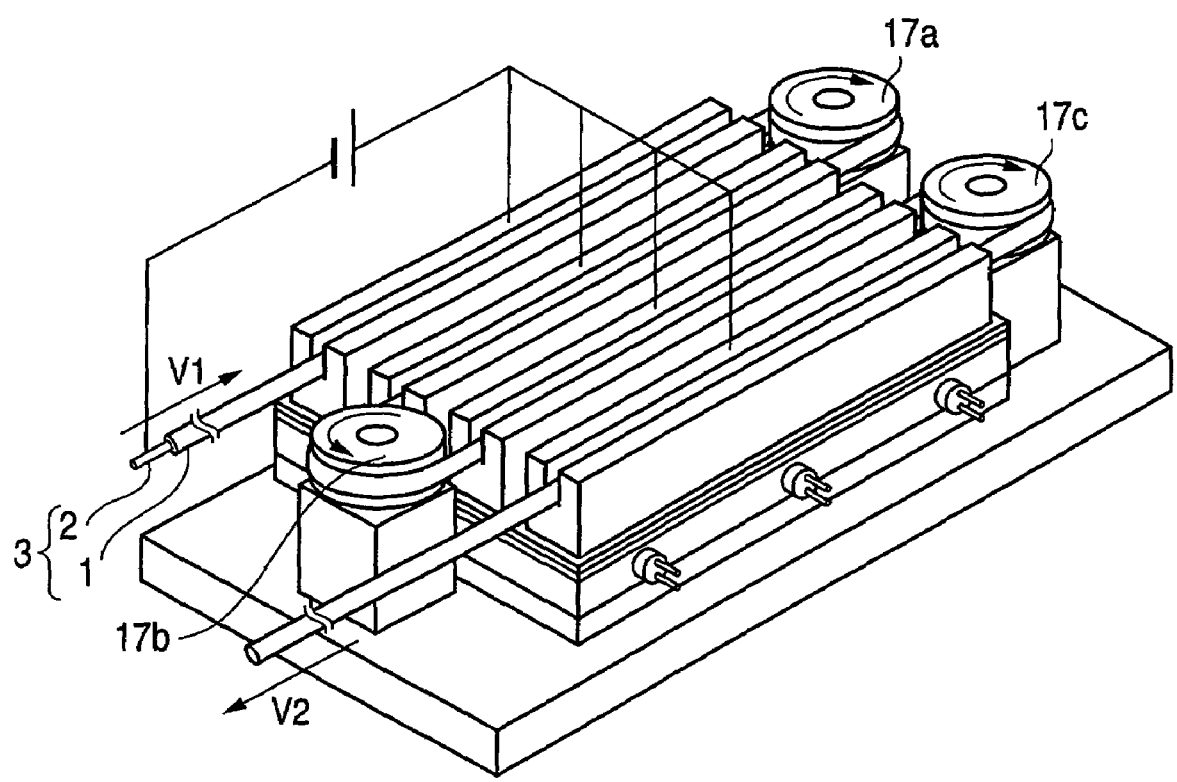
FIG. 5 is an outlook view showing a constitution of a polarizing apparatus according to Embodiment 2 of the invention.

FIG. 5 is an outlook view showing a constitution of a coaxial flexible piezoelectric polarizing apparatus according to a fifth embodiment. In FIG. 5, the pulleys 17a, 17b and 17c are provided with the same diameter and different rotational numbers. The rotational number of the pulley 17a, the rotational number of the pulley 17b and the rotational number of the pulley 17c are successively reduced little by little. Further, a drawing speed V2 of the piezoelectric tube 3 by drawing means (not illustrated) is made to be slightly slower than a feeding speed of the piezoelectric tube 3. The apparatus of Embodiment 5 is the same as the apparatus of Embodiment 4 except that the rotational numbers of the pulleys 17a, 17b and 17c are successively reduced.

The piezoelectric tube 3 is moved by the pulleys 17a, 17b and 17c arranged at fold back portions of the piezoelectric tube 3. Further, since the speed of moving the piezoelectric tube 3 by the pulleys 17a, 17b and 17c is successively retarded, portions of the piezoelectric tube 3 are not pulled by each other by a difference between elongations of the portions of the piezoelectric tube 3 or by a slight difference between the rotational numbers of the pulleys. That is, since an amount of feeding the piezoelectric tube 3 by the pulley 17a is larger than an amount of drawing the piezoelectric tube 3 by the pulley 17b and therefore, a slack is produced between the pulley 17a and the pulley 17b and the pulley 17a feeds the piezoelectric tube 3 by an amount of pulling the piezoelectric tube 3 by the pulley 17b. Therefore, the pulley 17a and the pulley 17b do not pull the piezoelectric tube 3 to each other. The same goes with a relationship between the pulley 17b and the pulley 17c. Further, the same relationship is established since the drawing speed V2 of the piezoelectric tube 3 by drawing means (not illustrated) is made to be slightly slower than the feeding speed of the piezoelectric tube 3. By the above-described, the above-described effect is achieved in addition to the effect of (Embodiment 4).

Embodiment 6

Figure 6:
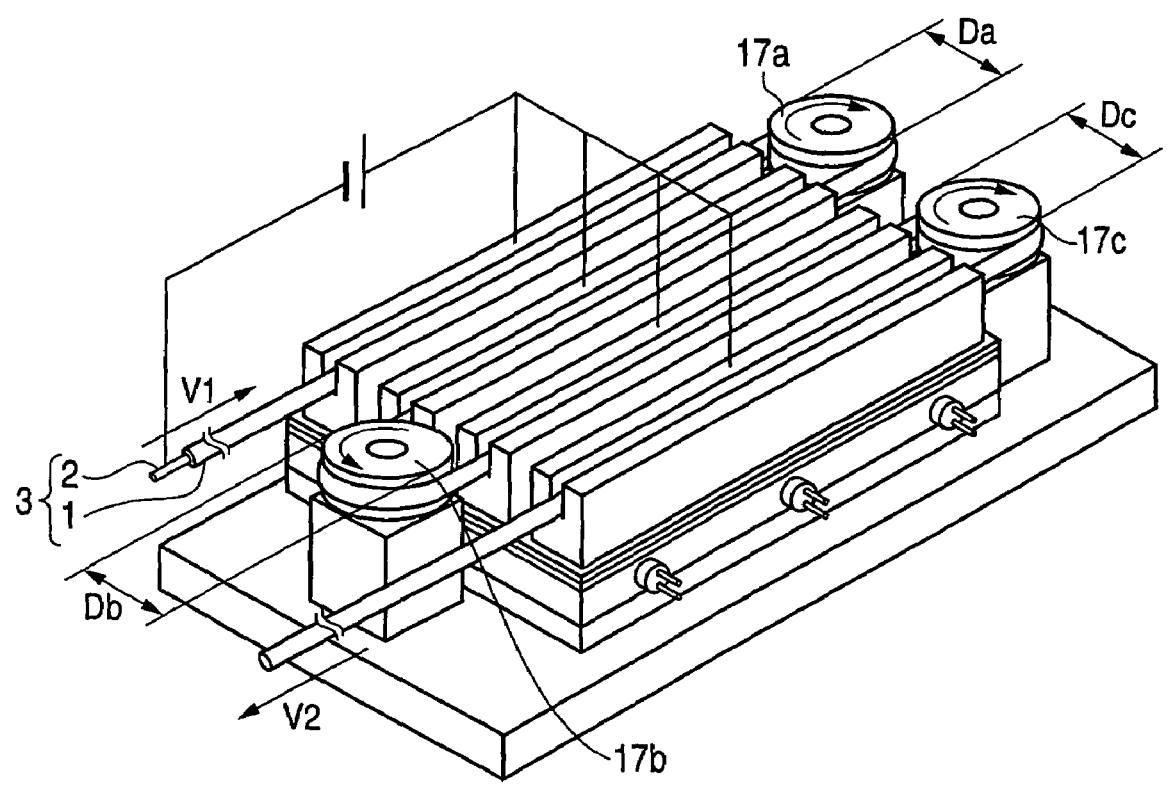
FIG. 6 is an outlook view showing a constitution of a polarizing apparatus according to Embodiment 3 of the invention.
Figure 7:
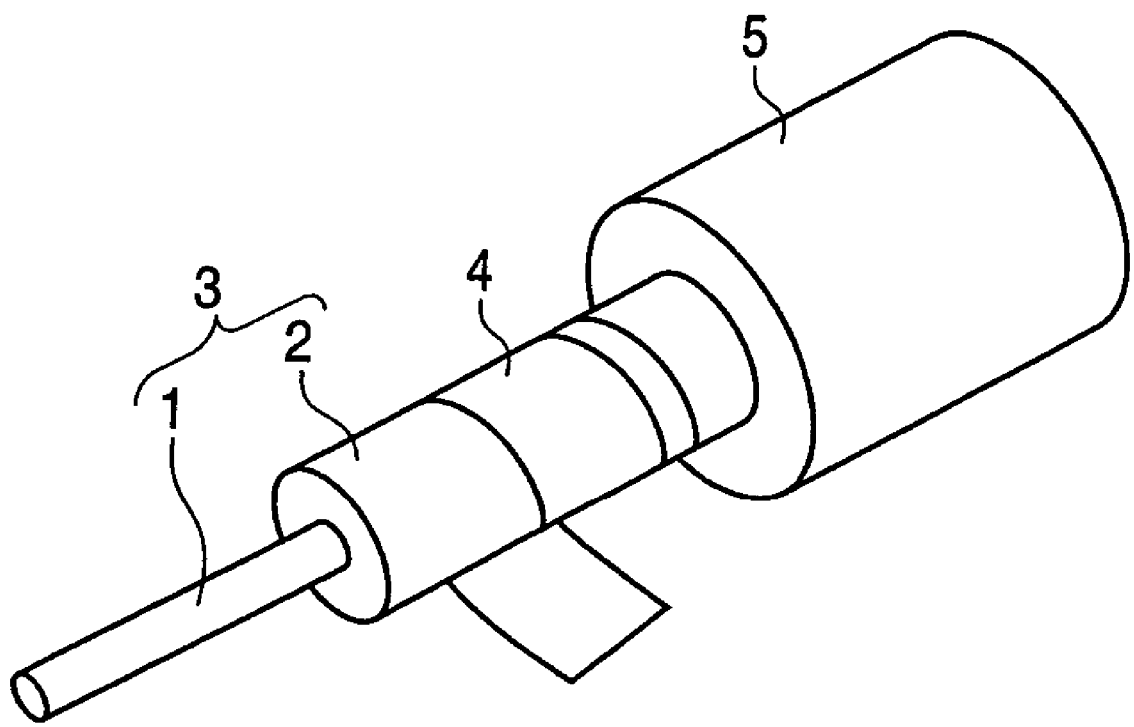
FIG. 7 is an outlook perspective view showing a constitution of a coaxial flexible piezoelectric cable.
Figure 8:
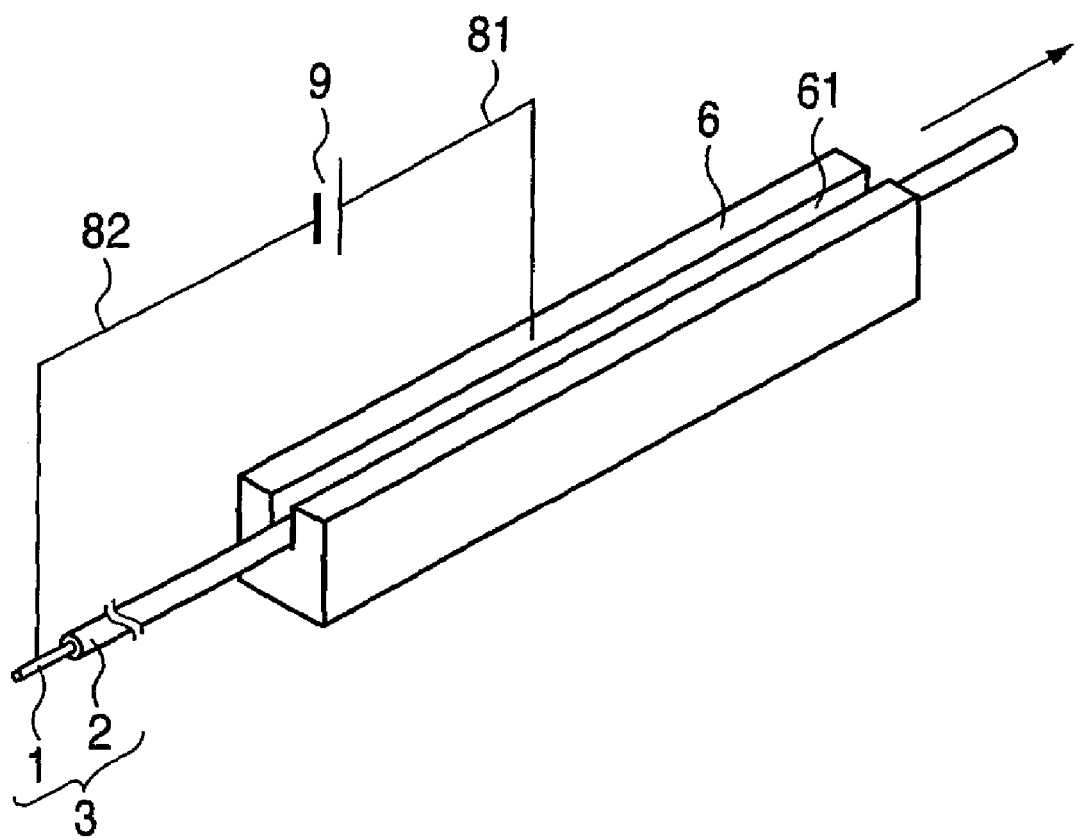
FIG. 8 is an outlook perspective view showing a constitution of a polarizing apparatus of a coaxial flexible piezoelectric cable of a background art.
Figure 9:
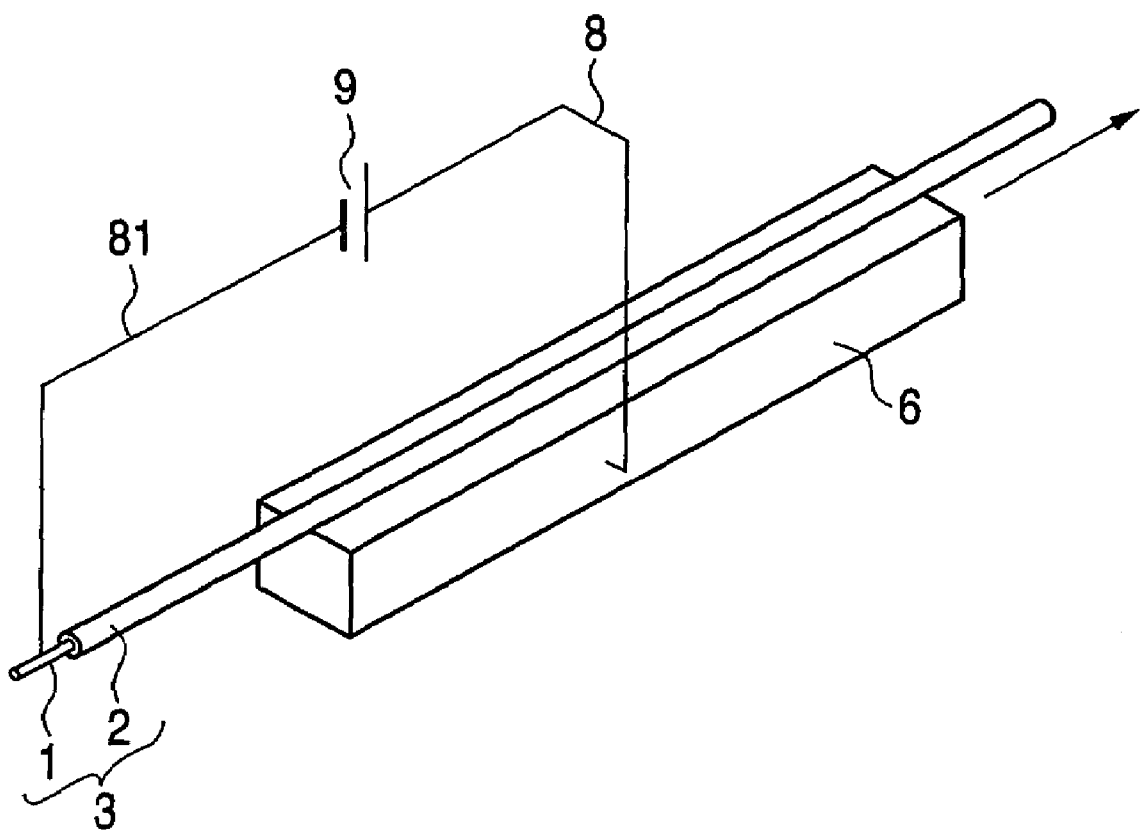
FIG. 9 is an outlook perspective view showing a constitution of a polarizing apparatus of a coaxial flexible piezoelectric cable of a background art.

FIG. 6 is an outlook view showing a constitution of a coaxial flexible piezoelectric polarizing apparatus according to a sixth embodiment of the invention. In FIG. 6, the pulleys 17a, 17b and 17c are provided with the same rotational number and different diameters. The diameter of the pulley 17a, the diameter of the pulley 17b and the diameter of the pulley 17c are successively reduced little by little. Further, the drawing speed V2 of the piezoelectric tube 3 by drawing means (not illustrated) is made to be slower than the feeding speed of the piezoelectric tube 3 by the pulley 17c. The apparatus of Embodiment 6 is the same as the apparatus of Embodiment 1 except that the diameters of the pulleys 17a, 17b and 17c are successively reduced.

The piezoelectric tube 3 is moved by the pulleys 17a, 17b and 17c arranged at fold back portions of the piezoelectric tube 3. Further, since speeds of moving the piezoelectric tube 3 by the pulleys 17a, 17b and 17c are successively retarded, portions of the piezoelectric tube 3 are not pulled by each other by a difference of elongations of the portions of the piezoelectric tube 3 or by a slight difference between the rotational numbers of the pulleys. That is, since the amount of feeding the piezoelectric tube 3 by the pulley 17a is larger than the amount of drawing the piezoelectric tube 3 by the pulley 17b, a slack is produced between the pulley 17a and the pulley 17b and the pulley 17a feeds the piezoelectric tube 3 only by the amount of pulling the piezoelectric tube 3 by the pulley 17b. Therefore, the pulley 17a and the pulley 17b do not pull the piezoelectric tube 3 to each other. The same goes with the relationship between the pulley 17b and the pulley 17c. Further, the same relationship is established since the drawing speed V2 of the piezoelectric tube 3 by drawing means (not illustrated) is made to be slightly slower than the feed speed of the piezoelectric tube 3 by the pulley 17c. By the above-described, the above-described effect is achieved in addition to the effect of (Embodiment 4).

Embodiment 7

Figure 10:
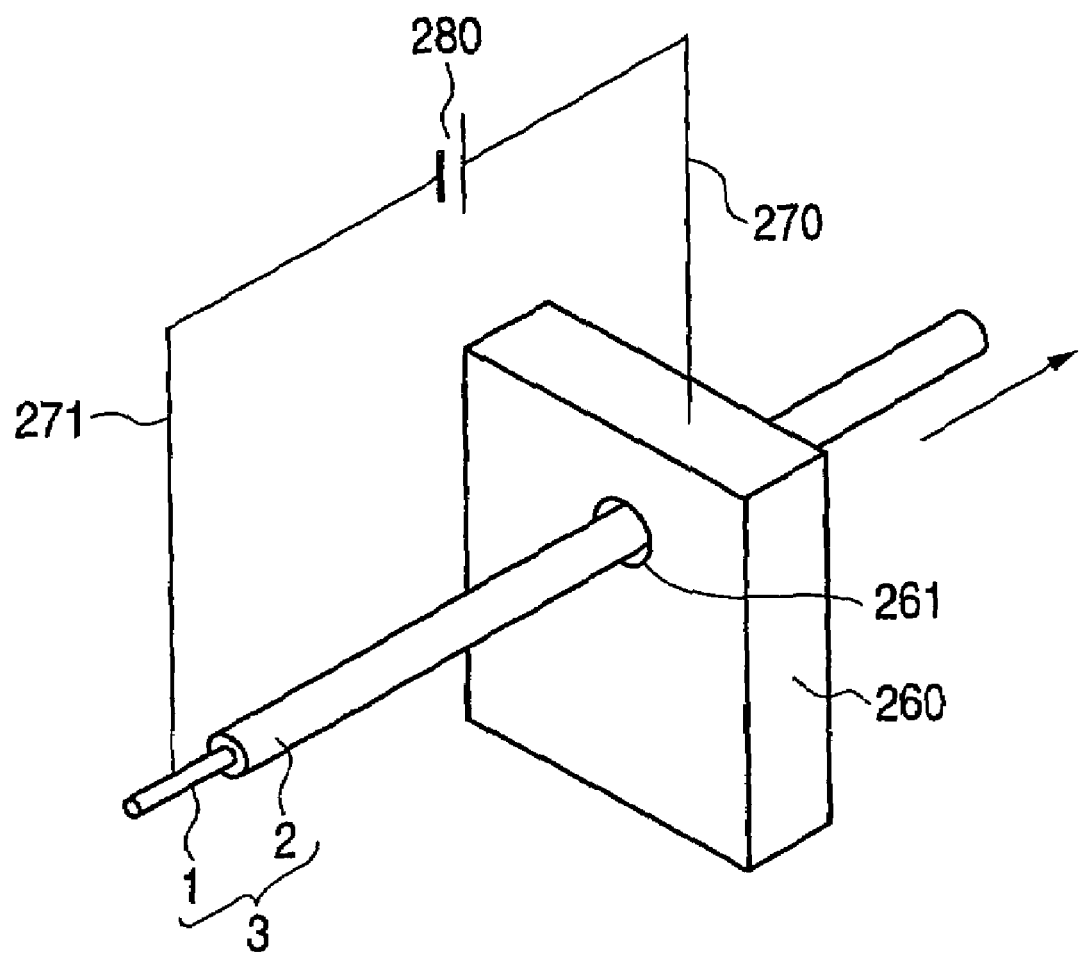
FIG. 10 is a constitution view of a defect detecting apparatus of a coaxial piezoelectric cable according to Embodiment 7 of the invention.

FIG. 10 is an outlook view showing a constitution of a defect detecting apparatus of the coaxial flexible piezoelectric member 2 according to Embodiment 7 of the invention. The piezoelectric tube 3 is constituted by forming the coaxial flexible piezoelectric member 2 for the core electrode 1. As the core electrode 1, a coil-like metal line or a line bundled with metal slender lines or the like is used. As the flexible piezoelectric member 2, there is used a composite piezoelectric member of a polymer base material of epoxy resin, urethane resin, chloroprene resin, chlorinated polyethylene resin or the like added with a ceramic piezoelectric powder of titanate zirconate lead or a polymer piezoelectric member of PVDF or the like. The piezoelectric tube 3 is moved by moving means (not illustrated) by way of the inspecting electrode means 260. In this case, an outer peripheral face of the coaxial flexible piezoelectric member 2 is arranged at the hole 261 of the inspecting electrode means 260. The inspecting electrode means 260 is connected to one pole of the direct current voltage generating means 280 via the lead wire 270 and the core electrode 1 is connected to other pole of the direct current voltage generating means 280 via the lead wire 271, respectively. Further, in FIG. 10, a direction of moving the piezoelectric tube 3 arranged at the hole 261 of the inspecting electrode means 260 is indicated by an arrow mark. An inner diameter dimension of the hole 261 is slightly larger than an outer diameter dimension of the piezoelectric tube 3. According to the embodiment, a diameter of the hole 261 is made to be 2.2 millimeters in contrast to the piezoelectric tube 3 having the outer diameter of 1.8 millimeters.

Direct current voltage is applied between the inspecting electrode means 260 and the core electrode 1 by the direct current voltage applying means 280 to apply on the coaxial flexible piezoelectric member to be inspected. According to the embodiment, a voltage of 4 kV is applied thereto. At this occasion, when a defect is present at the coaxial flexible piezoelectric member to be inspected, small discharge is brought about at the defect portion. In accordance with the small discharge, discharge current is made to flow, sound or light is emitted and therefore, presence of the defect can easily be detected. Therefore, it can be specified that the defect is present at the coaxial flexible piezoelectric member to be inspected. Further, when the piezoelectric tube 3 is arranged at the hole 261 of the inspecting electrode means 260, and the piezoelectric tube 3 is stationary or moved by moving means (not illustrated), direct current voltage can be applied between the core electrode 1 and the inspecting electrode means 260 and therefore, the defect can continuously be detected.

Any of the inspecting electrode means 260 can be used so far as the inspecting electrode means 260 is a conductor. As the inspecting electrode means 260, a metal which is easily available and easy to work (copper, aluminum, brass, iron, stainless steel or the like) is preferable. Further, as the inspecting electrode means 260, graphite is also preferable. Similar to a metal, graphite is easily available and easy to work. Further, graphite is provided with not only conductivity but also small friction resistance. That is, when the piezoelectric tube 260 is moved by moving means (not illustrated), the piezoelectric tube 260 can be moved by a smaller force.

In order to ensure safety of defect inspecting operation, it is preferable to connect the inspecting electrode means 260 to a positive pole or a negative pole of the direct current voltage applying means 280 and connect the core electrode 11 to the ground. Since direct current voltage portions are limited to the inspecting electrode means 260 and the lead wire 270 and the like and therefore, by isolating only the portions from an outer field, a possibility of bringing the human body into contact with the direct current voltage portions can easily be reduced. On the other hand, when the core electrode 1 is connected to a positive pole or a negative pole of the direct current voltage applying means 8, the core electrode 1 is maintained at high voltage and therefore, the direct current voltage portions are present at a total of the defect inspecting apparatus. Therefore, the possibility of bringing the human body into contact with the high voltage portion is enhanced.

Embodiment 8

Figure 11:
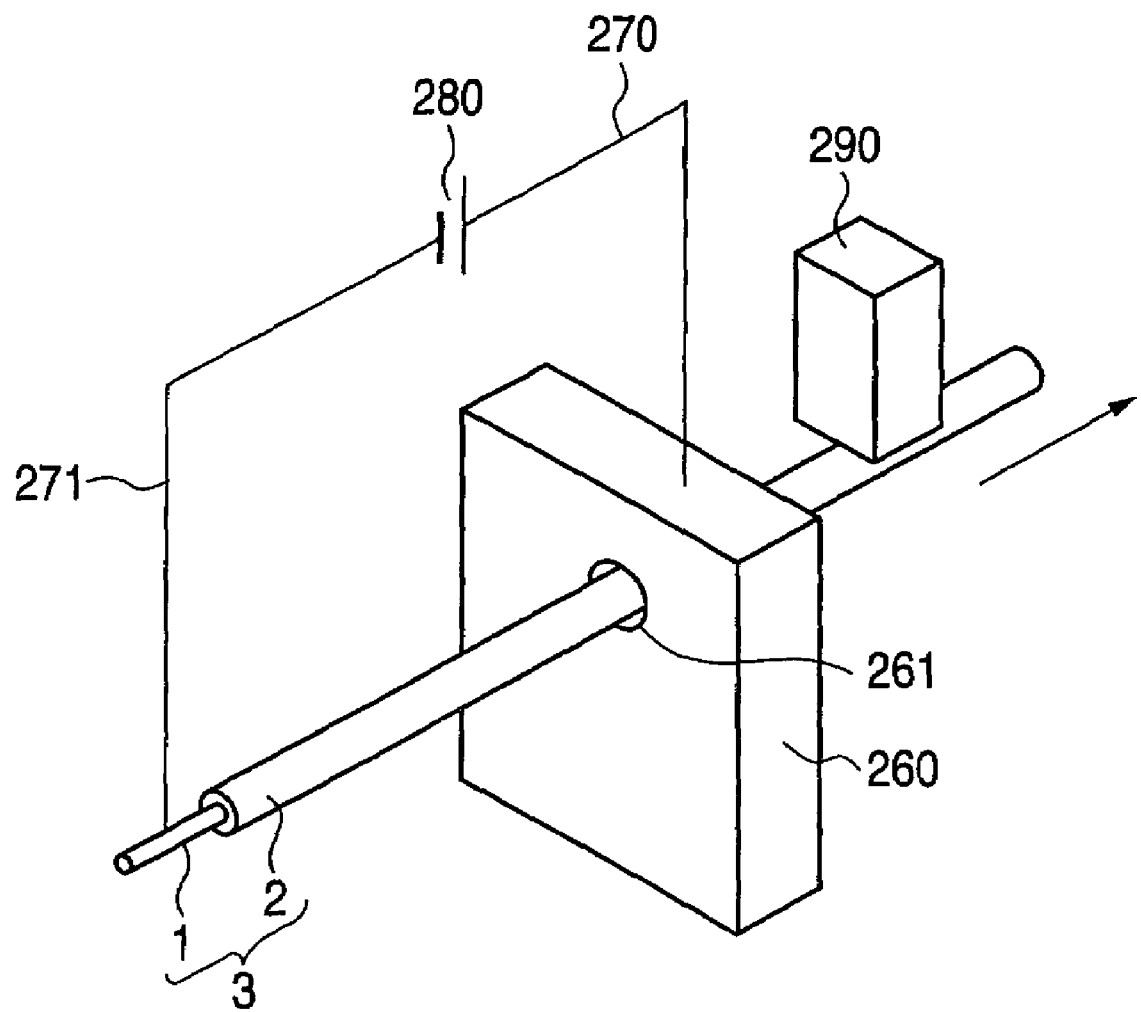
FIG. 11 is a constitution view of a defect detecting apparatus of a coaxial piezoelectric cable according to Embodiment 8 of the invention.

FIG. 11 is an outlook view showing a constitution of a defect detecting apparatus of the coaxial flexible piezoelectric member 2 according to Embodiment 8 of the invention. The marking means 290 is arranged before or after the inspecting electrode means 260. When a defect is detected by discharge current or sound or light in accordance with small discharge brought about at the defect portion, by operating the marking means, a portion before or after the defect portion of the coaxial flexible piezoelectric member to be inspected can be marked. Further, therefore, the portion at which the defect is present can clearly be specified.

Further, by arranging the marking means 290 after the inspecting electrode means 260, the defect portion of the coaxial flexible piezoelectric member 2 can be marked. That is, the defect portion of the coaxial flexible piezoelectric member can be marked by operating the marking means when the defect portion of the coaxial flexible piezoelectric member to be inspected at which small discharge is brought about is moved from the inspecting electrode means 260 to a position of the marking means 290.

Embodiment 9

Figure 12:
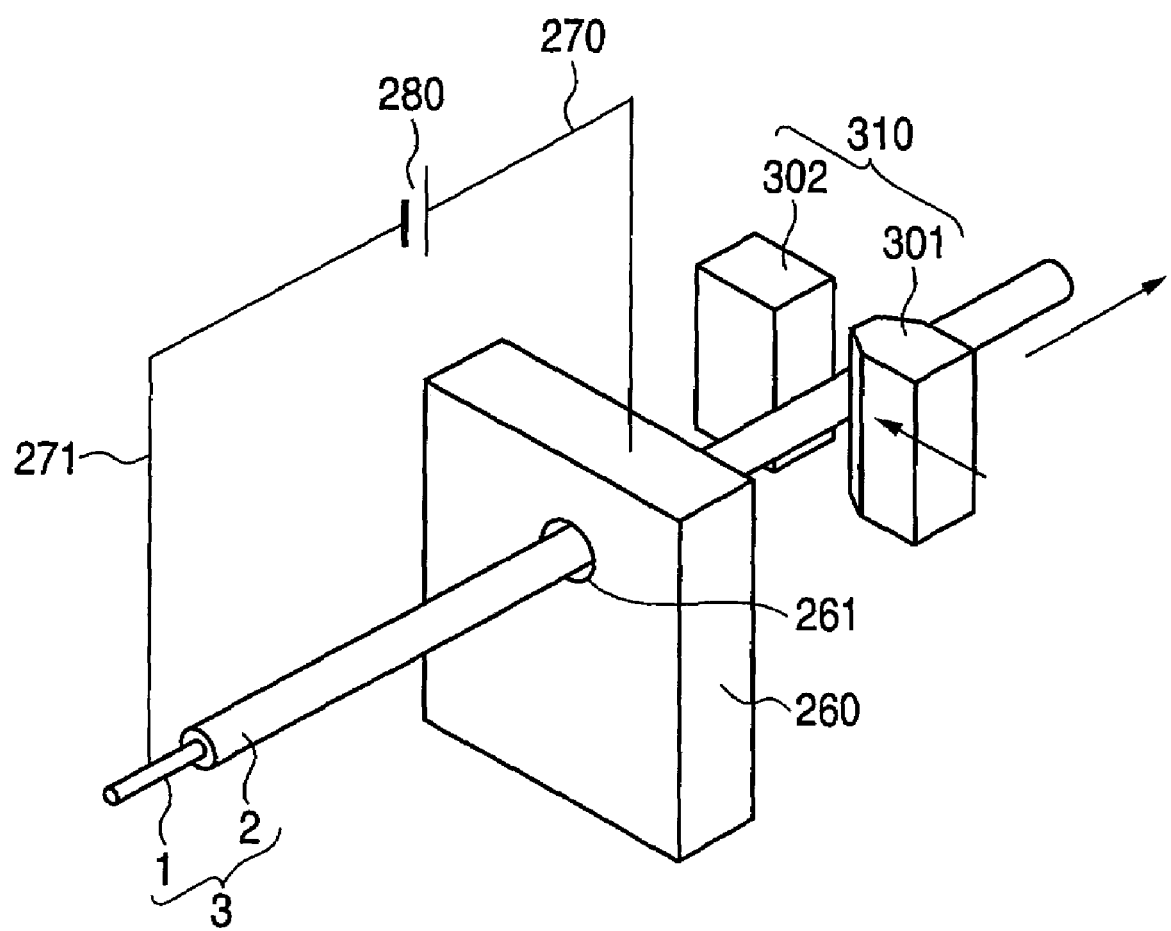
FIG. 12 is a constitution view of a defect detecting apparatus of a coaxial piezoelectric cable according to Embodiment 9 of the invention.

FIG. 12 is an outlook view showing a constitution of a defect detecting apparatus of the coaxial flexible piezoelectric member 2 according to Embodiment 9 of the invention.

According to the embodiment, the marking means 290 is the clamp apparatus 310. The coaxial flexible piezoelectric member 2 is deformed by being clamped by the clamp apparatus 310 to press. Therefore, the portion at which the effect is present can clearly be determined. The clamp apparatus 310 is constituted by a structure of clamping the coaxial flexible piezoelectric member 2 by the clamp metal piece 301 and the clamp metal piece 302 by utilizing hydraulic pressure or electricity as power. A clamping force may be a force of deforming the coaxial flexible piezoelectric member 2. According to the embodiment, clamping is carried out by a force of 5 newtons. The clamp apparatus 310 is arranged before or after the inspecting electrode means 260. When a defect is detected by discharge current or sound or light in accordance with small discharge brought about at the defect portion, by operating the clamp apparatus 310, a portion before or after the defect portion of the coaxial flexible piezoelectric member to be inspected can be marked. Therefore, the portion at which the defect is present can clearly be specified.

Further, by arranging the clamp apparatus 310 after the inspecting electrode means 260, the defect portion of the coaxial flexible piezoelectric member 2 can be marked. That is, when the defect portion of the coaxial flexible piezoelectric member to be inspected at which small discharge is brought about is moved from the inspecting electrode means 260 to the position of the clamp apparatus 310, the defect portion of the coaxial flexible piezoelectric member can be marked by operating the clamp apparatus 310.

Embodiment 10

Figure 13:
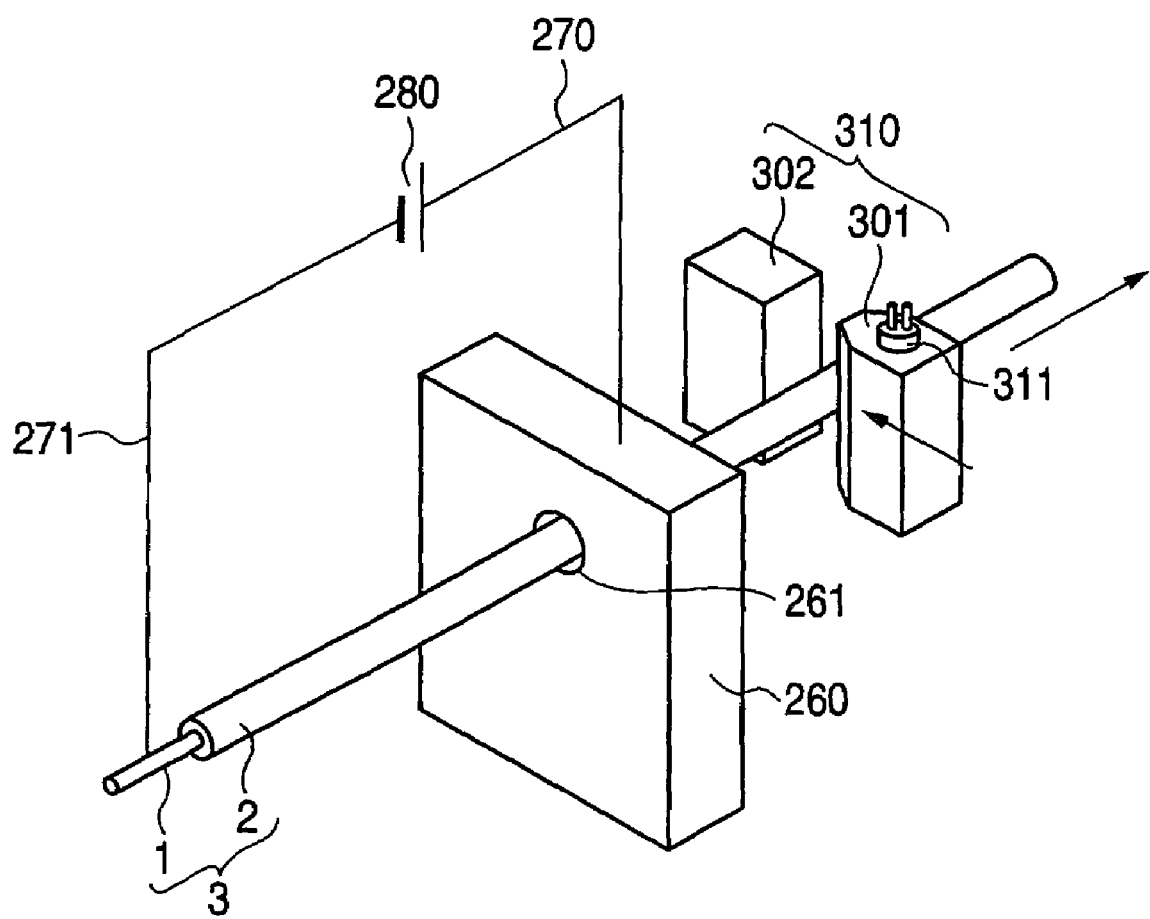
FIG. 13 is a constitution view of a defect detecting apparatus of a coaxial piezoelectric cable according to Embodiment 10 of the invention.

FIG. 13 is an outlook view showing a constitution of a defect detecting apparatus of the coaxial flexible piezoelectric member 2 according to Embodiment 10 of the invention.

According to the embodiment, the marking means 290 is the clamp apparatus 310 having the heater 311. When the coaxial flexible piezoelectric member 2 is clamped by the clamp apparatus 310, the coaxial flexible piezoelectric member 2 is deformed by being heated simultaneously. The resin included in the coaxial flexible piezoelectric member 2 is softened and a pressed and heated portion is easily deformed. Therefore, a portion at which the defect is present can clearly be determined.

The clamp apparatus 310 is constituted by a structure of clamping the coaxial flexible piezoelectric member 2 by the clamp metal piece 301 and the clamp metal piece 302 by utilizing air, hydraulic pressure or electricity as power. The clamping force may be a force of deforming the coaxial flexible piezoelectric member 2. According to the embodiment, the coaxial flexible piezoelectric member 2 is clamped by a force of 2 newtons. The clamp apparatus 310 is arranged before or after the inspecting electrode means 160. When a defect is detected by discharge current or sound or light in accordance with small discharge brought about at the defect portion, a portion of the coaxial flexible piezoelectric member to be inspected before or after the defect portion can be marked by operating the clamp apparatus 310. Therefore, a portion at which the defect is present can clearly be determined.

Further, the defect portion of the coaxial flexible piezoelectric member 2 can be marked by arranging the clamp apparatus 310 after the inspecting electrode means 260. That is, when the defect portion of the coaxial flexible piezoelectric member to be inspected at which small discharge is brought about is moved from the inspecting electrode means 260 to a position of the clamp apparatus 310, the defect portion of the coaxial flexible piezoelectric member can be marked by operating the clamp apparatus 320.

Embodiment 11

Figure 14:
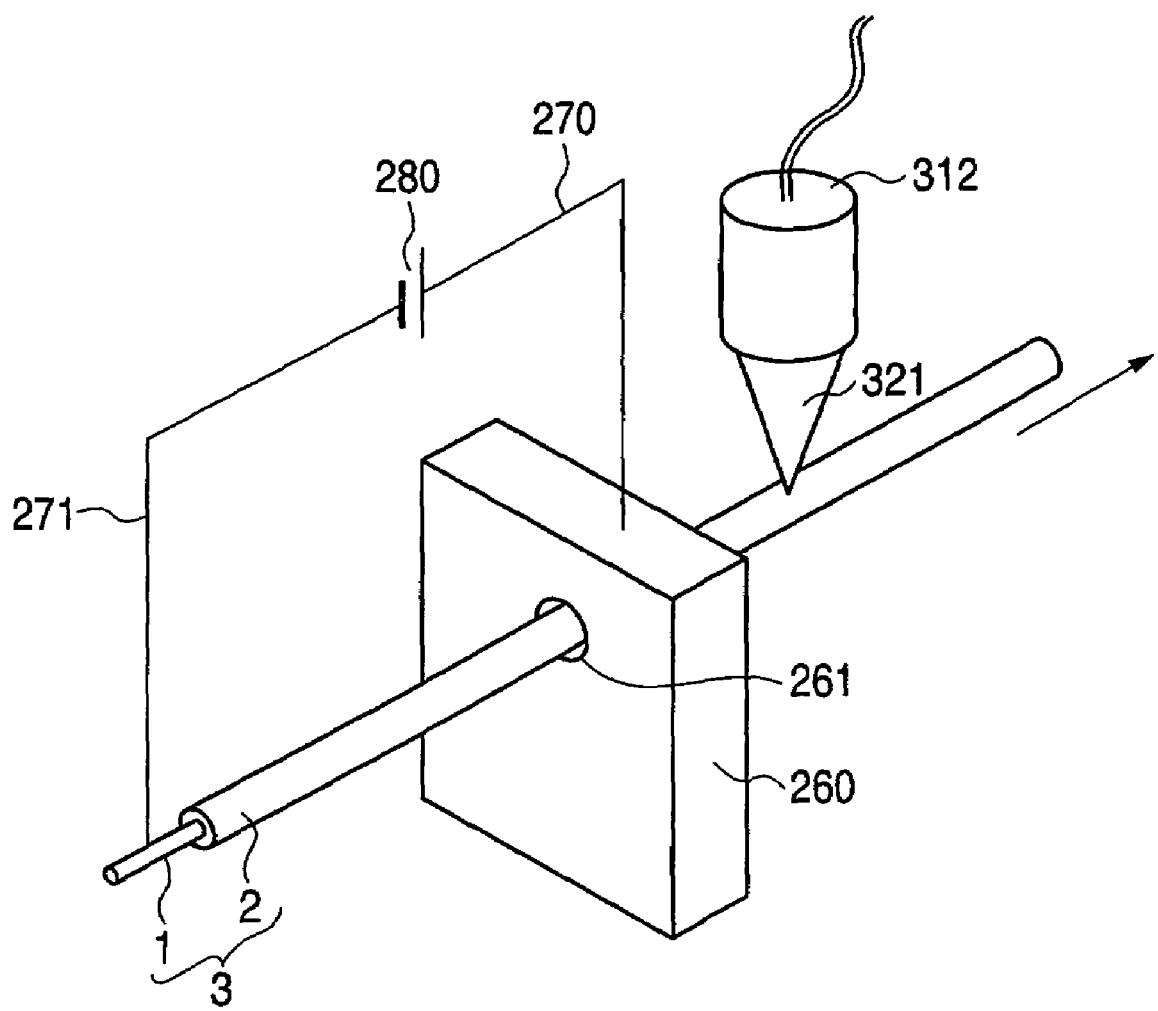
FIG. 14 is a constitution view of a defect detecting apparatus of a coaxial piezoelectric cable according to Embodiment 11 of the invention.

FIG. 14 is an outlook view showing a constitution of a defect detecting apparatus of the coaxial flexible piezoelectric member 2 according to Embodiment 11 of the invention.

According to the embodiment, the marking means 290 is the laser heating apparatus 312. The coaxial flexible piezoelectric member 2 is melted by being heated by the laser heating apparatus 312. Therefore, the portion at which the defect is present can clearly be determined. As the laser heating apparatus 312, a carbon dioxide gas laser or a YAG laser apparatus which is generally used for industry is used. The laser beam 321 is irradiated to the coaxial flexible piezoelectric member 2. The laser heating apparatus 312 is arranged before or after the inspecting electrode means 260. By discharge current or sound or light in accordance with small discharge brought about at the defect portion, when the defect is detected, a portion of the coaxial flexible piezoelectric member to be inspected before or after the detect portion can be marked by operating the laser heating apparatus 312. Therefore, the portion at which the defect is present can clearly be specified.

Further, by arranging the laser heating apparatus 312 after the inspecting electrode means 260, the defect portion of the coaxial flexible piezoelectric member 2 can be marked. That is, when the defect portion of the coaxial flexible piezoelectric member to be inspected at which small discharge is brought about is moved from the inspecting electrode means 260 to a position of the laser heating apparatus 312, the defect portion of the coaxial flexible piezoelectric member can be marked by operating the laser heating apparatus 312.

Embodiment 12

Figure 15:
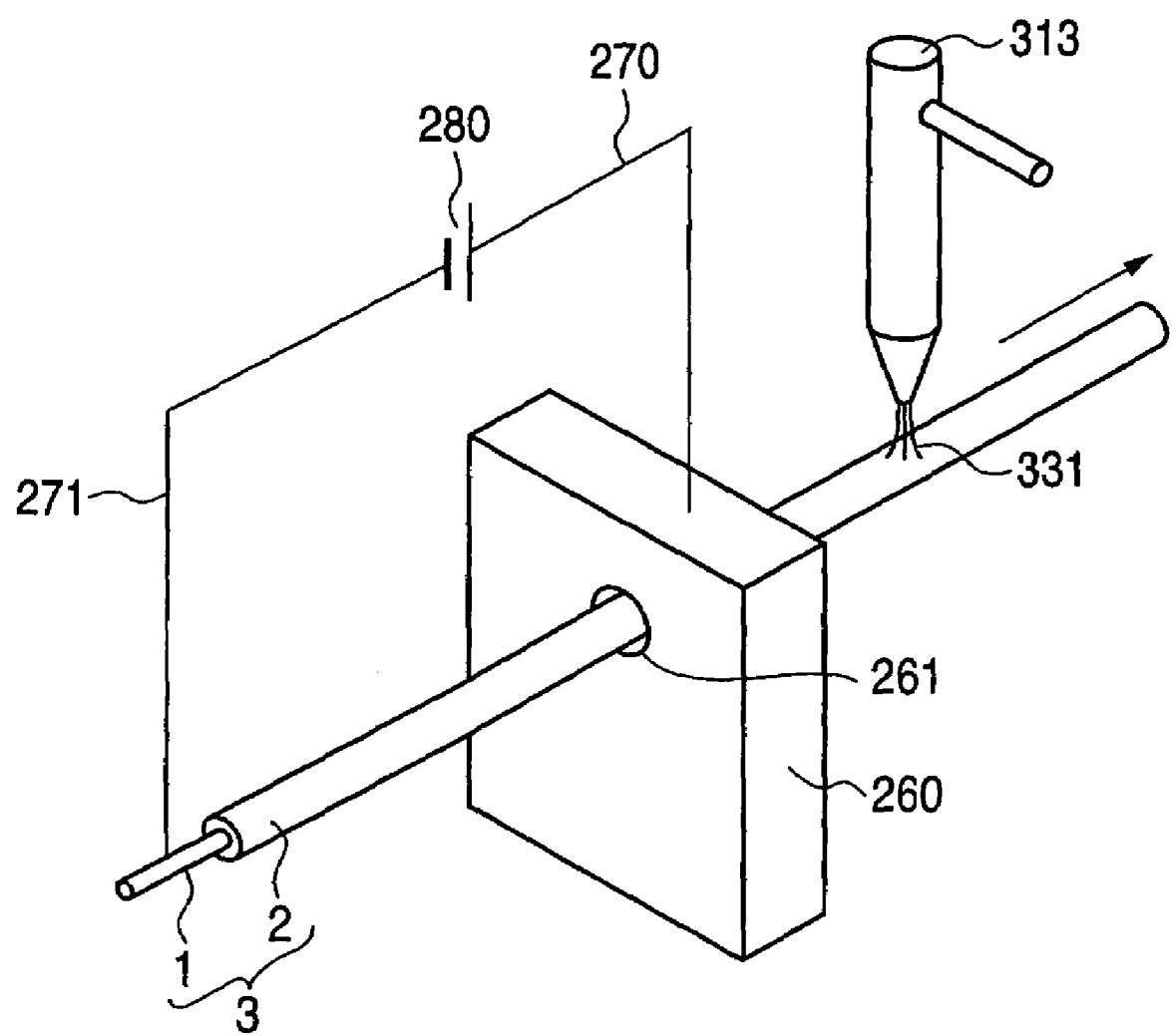
FIG. 15 is a constitution view of a defect detecting apparatus of a coaxial piezoelectric cable according to Embodiment 12 of the invention.

FIG. 15 is an outlook view showing a constitution of a defect detecting apparatus of the coaxial flexible piezoelectric member 2 according to Embodiment 12 of the invention.

According to the embodiment, the marking means 290 is the hot wind heating apparatus 313. The coaxial flexible piezoelectric member 2 is melted by being heated by the hot wind heating apparatus 313. Therefore, the portion at which the defect is present can clearly be determined. The hot wind 331 blown from the hot wind heating apparatus 313 is injected to the coaxial flexible piezoelectric member 2. The hot wind heating apparatus 313 is arranged before or after the detecting electrode means 260. By discharge current or sound or light in accordance with small discharge brought about at the defect portion, when the defect is detected, a portion of the coaxial flexible piezoelectric member to be inspected before or after the defect portion can be marked by operating the hot wind heating apparatus 313. Therefore, the portion at which the defect is present can clearly be specified.

Further, by arranging the hot wind heating apparatus 313 after the inspecting electrode means 260, the defect portion of the coaxial flexible piezoelectric member 2 can be marked. That is, when the defect portion of the coaxial flexible piezoelectric member to be inspected at which small discharge is brought about is moved from the inspecting electrode means 260 to a position of the hot wind heating apparatus 313, the defect portion of the coaxial flexible piezoelectric member can be marked by operating the hot wind heating apparatus 313.

Embodiment 13

Figure 16:
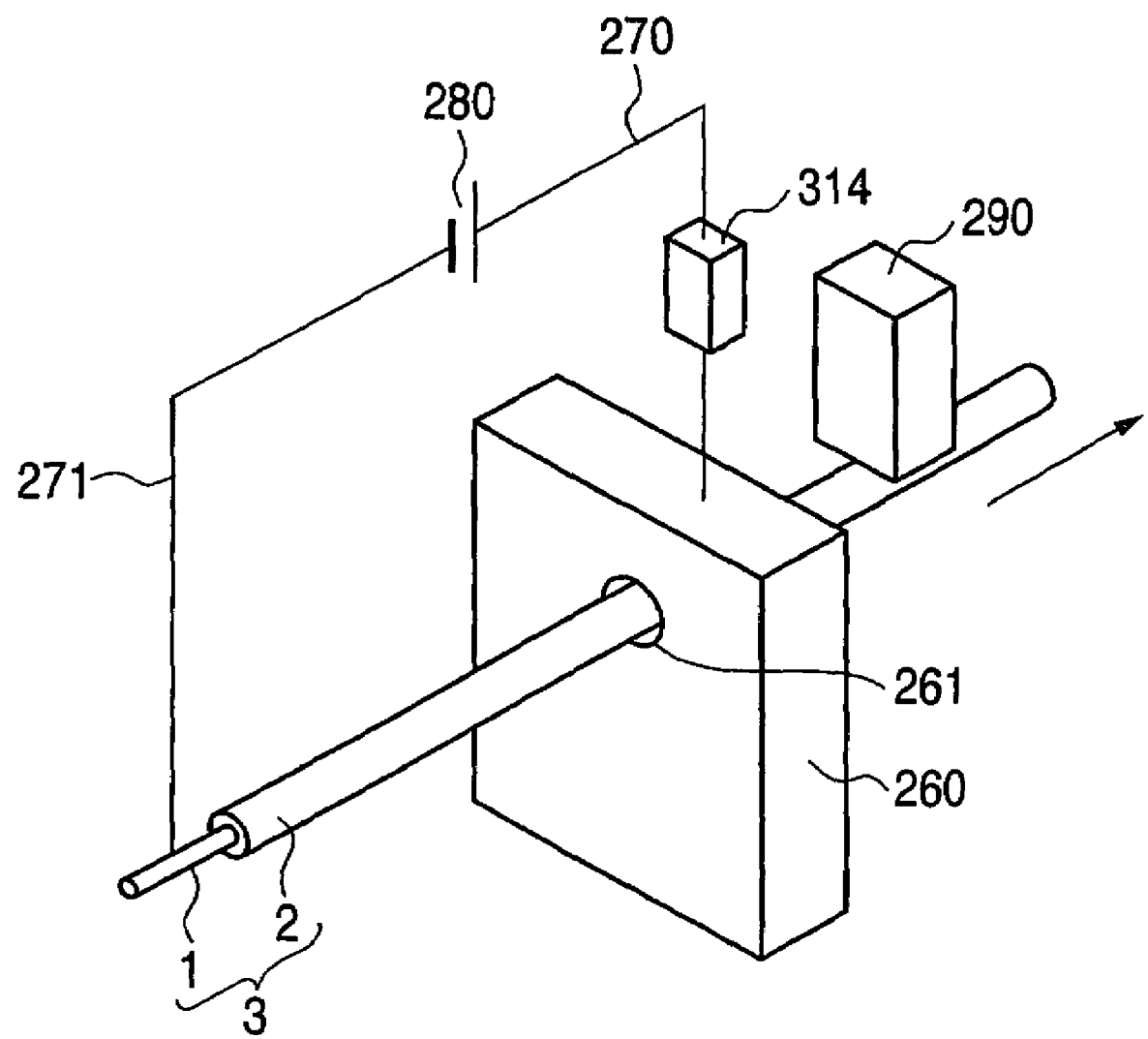
FIG. 16 is a constitution view of a defect detecting apparatus of a coaxial piezoelectric cable according to Embodiment 13 of the invention.

FIG. 16 is an outlook view showing a constitution of a defect detecting apparatus of the coaxial flexible piezoelectric member 2 according to Embodiment 13 of the invention.

The current detecting means 313 is provided between the core electrode 1 and the direct current voltage applying means 280 or between the inspecting electrode means 260 and the direct current voltage applying means 280. The marking means 290 is operated in correspondence with the current detecting means 314.

As described above, when a small defect is included in the coaxial flexible piezoelectric member 2 and the portion is arranged at the hole 261 of the inspecting electrode means 260, small discharge is brought about at the defect portion. At this occasion, discharge current is made to flow between the core electrode 1 and the inspecting electrode means 260.

Although a small amount of steady-state current flows even when the defect is not included, the discharge current is larger than the steady-state current by one digit or more. Therefore, it can be determined whether discharge caused by the defect is brought about by a current value.

For example, by determining whether the current value detected by the current detecting means 314 is equal to or higher than a predetermined value, only when the current value is equal to or higher than the predetermined value, the making means 290 can be operated. Therefore, when discharge is brought about, the surface of the flexible piezoelectric member 2 can be marked by the marking means 290. Thereby, a range in which the effect is present can automatically be specified.

Further, by arranging the making means 290 after the detecting electrode means 260, the defect portion of the coaxial flexible piezoelectric member 2 can be marked. That is, when the defect portion of the coaxial flexible piezoelectric member to be inspected at which small discharge is brought about is moved from the inspecting electrode means 260 to a position of the marking means 290, the defect portion of the coaxial flexible piezoelectric member can be marked by operating the making means 290.

INDUSTRIAL APPLICABILITY

As explained above, according to the invention according to Claims 1 through 5 of the invention, the path portion of the piezoelectric tube of the block-like conductor is provided with recesses and projections for reducing the friction resistance and therefore, by the recesses and projections, the friction force between the piezoelectric tube and the path portion of the piezoelectric tube is reduced and the piezoelectric tube can be moved by a small force.

Further, according to the invention described in Claims 6 through 7 of the invention, the friction force between the piezoelectric tube and the path portion of the piezoelectric tube is reduced and the piezoelectric tube can be moved by a small force. Therefore, when the piezoelectric tube is pulled to move, the piezoelectric tube is not elongated or broken and a highly reliable polarizing method can be provided.

Further, according to the invention described in Claims 8 through 13 of the invention, by dividing the block-like conductor by a plural number, the friction force between the path portion of the piezoelectric tube of the block-like conductor per divided one and the piezoelectric tube can be reduced. Further, the piezoelectric tube can be moved by a small force by the plurality of pulleys arranged at fold back portions of the piezoelectric tube.

Further, speeds of moving the piezoelectric tube of the plurality of pulleys arranged at the fold back portions of the piezoelectric tube are successively retarded. Therefore, the coaxial flexible piezoelectric member can be polarized without pulling portions of the piezoelectric tube to each other by a difference of elongation of the portions of the piezoelectric tube or a slight difference between rotational numbers of the pulleys.

Further, according to the invention according to Claims 14 through 26 of the invention, when a small defect is included in the flexible piezoelectric portion brought into contact with the inspecting electrode means, a range in which the defect is present can easily be detected.

Although an explanation has been given of the invention in details and in reference to the specific embodiments, it is apparent for the skilled person that the invention can variously be changed or modified without deviated from the spirit and the range of the invention.

The application is based on Japanese Patent Application applied on Aug. 2, 2001 (Japanese Patent Application No. 2001-234553, Japanese Patent Application No. 2001-234554, Japanese Patent Application No. 2001-234555) and Japanese Patent Application filed on Dec. 14, 2001 (Japanese Patent Application No. 2001-381350) and contents thereof are incorporated here by reference.

The invention claimed is:

1. A polarizing apparatus of a coaxial flexible piezoelectric cable comprising:
    a block-like conductor provided a path portion in a recessed and projected shape, said path portion is for a piezoelectric tube formed with a coaxial flexible piezoelectric member at a surrounding of a core electrode; and
    direct current voltage generating means connected to the block-like conductor and the core electrode.

2. The polarizing apparatus of a coaxial flexible piezoelectric cable according to claim 1, further comprising:
    a heater provided at the block-like conductor.

3. The polarizing apparatus of a coaxial flexible piezoelectric cable according to either one of claims 1 and 2,
    wherein a metal net is arranged at the block-like conductor and the path portion of the piezoelectric tube is constituted by the metal net.

4. The polarizing apparatus of a coaxial flexible piezoelectric cable according to either one of claims 1 and 2,
    wherein the block-like conductor is provided with a groove worked with recesses and projections and the path portion of the piezoelectric tube is constituted by the groove worked with the recesses and the projections.

5. The polarizing apparatus of a coaxial flexible piezoelectric cable according to either one of claims 1 and 2,
    wherein the block-like conductor is provided with a groove arranged with a metal net and the path portion of the piezoelectric tube is constituted by the groove arranged with the metal net.

6. A polarizing method of a coaxial flexible piezoelectric cable, wherein a block-like conductor is provided a path portion constituted by a recessed and projected shape, said path portion is for a piezoelectric tube formed with a coaxial flexible piezoelectric member at a surrounding of a core electrode, and wherein the piezoelectric tube is arranged at the path portion, said method comprising:
    a step of applying a direct current voltage between the block-like conductor and the core electrode.

7. The polarizing method of a coaxial flexible piezoelectric cable according to claim 6, further comprising:
    a step of heating the block-like conductor by a heater provided at the block-like conductor.

8. A polarizing apparatus of a coaxial flexible piezoelectric cable, said polarizing apparatus comprising:
    a block-like conductor having a path of a piezoelectric tube formed with a coaxial flexible piezoelectric member at a surrounding of a core electrode;
    moving means for moving the piezoelectric tube in a switchback manner; and
    direct current voltage generating means connected to the block-like conductor and the core electrode.

9. A polarizing apparatus of a coaxial flexible piezoelectric cable, said polarizing apparatus comprising:
    a plurality of block-like conductors each having a path of a piezoelectric tube formed with a coaxial flexible piezoelectric member at a surrounding of a core electrode;
    a plurality of moving means for moving the piezoelectric tube in a switchback manner; and
    direct current voltage generating means connected to the block-like conductor and the core electrode.

10. The polarizing apparatus of a coaxial flexible piezoelectric cable according to claim 8 or 9,
    wherein the path of the piezoelectric tube provided at the block-like conductor is a groove.

11. The polarizing apparatus of a coaxial flexible piezoelectric cable according to claim 8 or 9,
    wherein pulleys are used for the moving means.

12. The polarizing apparatus of a coaxial flexible piezoelectric cable according to claim 11,
    wherein diameters of the pulleys stay to be the same to the each other and rotational numbers thereof are successively retarded.

13. The polarizing apparatus of a coaxial flexible piezoelectric cable according to claim 11,
    wherein rotational numbers of the pulleys stay to be the same to each other and diameters thereof are successively reduced.

14. A defect detecting apparatus of a coaxial flexible piezoelectric cable, said defect detecting apparatus comprising:
    inspecting electrode means including a hole arranged with a piezoelectric tube formed with a coaxial flexible piezoelectric member at a surrounding of a core electrode;
    moving means arranged after the inspecting electrode means for moving the piezoelectric tube; and
    direct current voltage applying means connected to the inspecting electrode means and the core electrode.

15. The defect detecting apparatus of a coaxial flexible piezoelectric cable according to claim 14,
    wherein the inspecting electrode means made of a metal.

16. The defect detecting apparatus of a coaxial flexible piezoelectric cable according to claim 14,
    wherein the inspecting electrode means made of graphite.

17. The defect detecting apparatus of a coaxial flexible piezoelectric cable according to claim 14,
    wherein a pole of the direct current voltage applying means connected to the core electrode is maintained at a ground potential.

18. A defect detecting method of a coaxial flexible piezoelectric cable, wherein the piezoelectric tube is arranged at a hole provided at a conductor constituting inspecting electrode means, said method comprising:
    a step of applying a direct current voltage between a core line of the piezoelectric tube and the detecting electrode means.

19. The defect detecting apparatus of a coaxial flexible piezoelectric cable according to claim 14, further comprising:
    marking means arranged before or after the inspecting electrode means.

20. The defect detecting apparatus of a coaxial flexible piezoelectric cable according to claim 19,
    wherein the marking means is a clamp apparatus.

21. The defect detecting apparatus of coaxial flexible piezoelectric cable according to claim 20, further comprising:
 a heater at the clamp apparatus.

22. The defect detecting apparatus of a coaxial flexible piezoelectric cable according to claim 19,
 wherein the marking means is a laser heating apparatus.

23. The defect detecting apparatus of a coaxial flexible piezoelectric cable according to claim 19,
 wherein the marking means is a hot air heating apparatus.

24. The defect detecting apparatus of a coaxial flexible piezoelectric cable according to any one of claims 14 and 19 through 23, further comprising:
 current detecting means provided between the core electrode or the inspecting electrode means and the direct current voltage applying means.

25. A defect detecting method of a coaxial flexible piezoelectric cable, wherein a piezoelectric tube is arranged at a hole provided at a conductor constituting inspecting electrode means, said method comprising:
 a step of applying a direct current voltage between a core line of the piezoelectric tube and the inspecting electrode means.

26. The defect detecting method of a coaxial flexible piezoelectric cable according to claim 25, further comprising:
 a step of attaching a mark to a surface of the piezoelectric tube by operating marking means when a current is detected to flow by a predetermined value or more by the current detecting means.

* * * * *